United States Patent
Kuboi et al.

(10) Patent No.: US 8,649,893 B2
(45) Date of Patent: Feb. 11, 2014

(54) SEMICONDUCTOR MANUFACTURING DEVICE, SEMICONDUCTOR DEVICE MANUFACTURING METHOD, SIMULATION DEVICE, AND SIMULATION PROGRAM

(75) Inventors: Nobuyuki Kuboi, Tokyo (JP); Tetsuya Tatsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 314 days.

(21) Appl. No.: 12/962,816

(22) Filed: Dec. 8, 2010

(65) Prior Publication Data

US 2011/0160889 A1   Jun. 30, 2011

(30) Foreign Application Priority Data

Dec. 25, 2009   (JP) ................................. 2009-293839

(51) Int. Cl.
*G06F 19/00*   (2011.01)
(52) U.S. Cl.
USPC ............................. 700/104; 700/103; 700/121
(58) Field of Classification Search
None
See application file for complete search history.

(56) References Cited

U.S. PATENT DOCUMENTS

| | | | | |
|---|---|---|---|---|
| 5,252,178 A | * | 10/1993 | Moslehi | 134/1.1 |
| 5,573,597 A | * | 11/1996 | Lantsman | 118/723 MP |
| 5,843,239 A | * | 12/1998 | Shrotriya | 134/1.1 |
| 5,904,800 A | * | 5/1999 | Mautz | 156/345.1 |
| 5,954,887 A | * | 9/1999 | Hatano | 134/2 |
| 6,055,927 A | * | 5/2000 | Shang et al. | 118/723 ME |
| 6,106,634 A | * | 8/2000 | Ghanayem et al. | 134/19 |
| 6,178,919 B1 | * | 1/2001 | Li et al. | 118/723 E |
| 6,394,026 B1 | * | 5/2002 | Wicker et al. | 156/345.1 |
| 6,423,176 B1 | * | 7/2002 | Ito et al. | 156/345.47 |
| 6,432,255 B1 | * | 8/2002 | Sun et al. | 156/345.1 |
| 6,583,064 B2 | * | 6/2003 | Wicker et al. | 438/710 |
| 6,669,812 B2 | * | 12/2003 | Jiwari | 156/345.47 |
| 6,777,880 B2 | * | 8/2004 | Morfill et al. | 315/111.21 |
| 6,786,935 B1 | * | 9/2004 | Powell | 29/25.01 |
| 6,842,658 B2 | * | 1/2005 | Izawa et al. | 700/121 |
| 7,335,601 B2 | * | 2/2008 | Han et al. | 438/714 |
| 7,799,138 B2 | * | 9/2010 | Fontejon et al. | 134/1.1 |
| 7,931,776 B2 | * | 4/2011 | Itabashi et al. | 156/345.24 |
| 8,101,510 B2 | * | 1/2012 | Godet et al. | 438/513 |
| 8,137,473 B2 | * | 3/2012 | Moriya et al. | 134/21 |
| 8,206,513 B2 | * | 6/2012 | Moriya et al. | 134/21 |
| 8,257,498 B2 | * | 9/2012 | Yamawaku et al. | 118/719 |
| 8,337,629 B2 | * | 12/2012 | Moriya et al. | 134/21 |
| 2002/0160125 A1 | * | 10/2002 | Johnson et al. | 427/569 |
| 2003/0037801 A1 | * | 2/2003 | Bailey et al. | 134/1 |
| 2005/0087136 A1 | * | 4/2005 | Moriya et al. | 118/719 |

(Continued)

FOREIGN PATENT DOCUMENTS

JP   2002-110635   4/2002

OTHER PUBLICATIONS

R. Tsai, Y.P. Chang, and T.Y. Lin; "Combined Effects of Thermophoresis and Electrophoresis on Particle Deposition onto a Wafer"; Journal of Aerosol Science; vol. 29, No. 7; pp. 811-825; 1998.*

Chieh-Li Chen and Kun-Chieh Chan; "Combined Effects of Thermophoresis and Electrophoresis on Particle Deposition onto a Wavy Surface Disk"; International Journal of Heat and Mass Transfer; vol. 51; pp. 2657-2664; Dec. 3, 2007.*

(Continued)

*Primary Examiner* — Kavita Padmanabhan
*Assistant Examiner* — Christopher E Everett
(74) *Attorney, Agent, or Firm* — Dentons US LLP

(57) ABSTRACT

Disclosed herein is a semiconductor manufacturing device including, a chamber, a sensor, a sticking probability calculating section, an acting section, and a control section.

19 Claims, 14 Drawing Sheets

(56) References Cited

U.S. PATENT DOCUMENTS

2006/0060303 A1* 3/2006 Fink et al. ............... 156/345.29
2006/0169207 A1* 8/2006 Kobayashi et al. ........... 118/715
2008/0003358 A1* 1/2008 Yim et al. .................. 427/248.1
2008/0142159 A1* 6/2008 Sasaki ..................... 156/345.41
2008/0142481 A1* 6/2008 White et al. .................. 216/67
2008/0245387 A1* 10/2008 Moriya et al. .................... 134/1
2008/0245389 A1* 10/2008 Moriya et al. ................. 134/1.1
2009/0065146 A1* 3/2009 Yamashita ............... 156/345.29

OTHER PUBLICATIONS

Costas J. Spanos, Hai-Fang Guo, Alan Miller, and Joanne Levine-Parrill; "Real-Time Statistical Process Control Using Tool Data"; IEEE Transactions on Semiconductor Manufacturing; vol. 5, No. 4; pp. 308-318; Nov. 1992.*

Peter Borden; "The Nature of Particle Generation in Vacuum Process Tools"; IEEE Transactions on Semiconductor Manufacturing; vol. 3, No. 4; pp. 189-194; Nov. 1990.*

* cited by examiner

F I G . 1
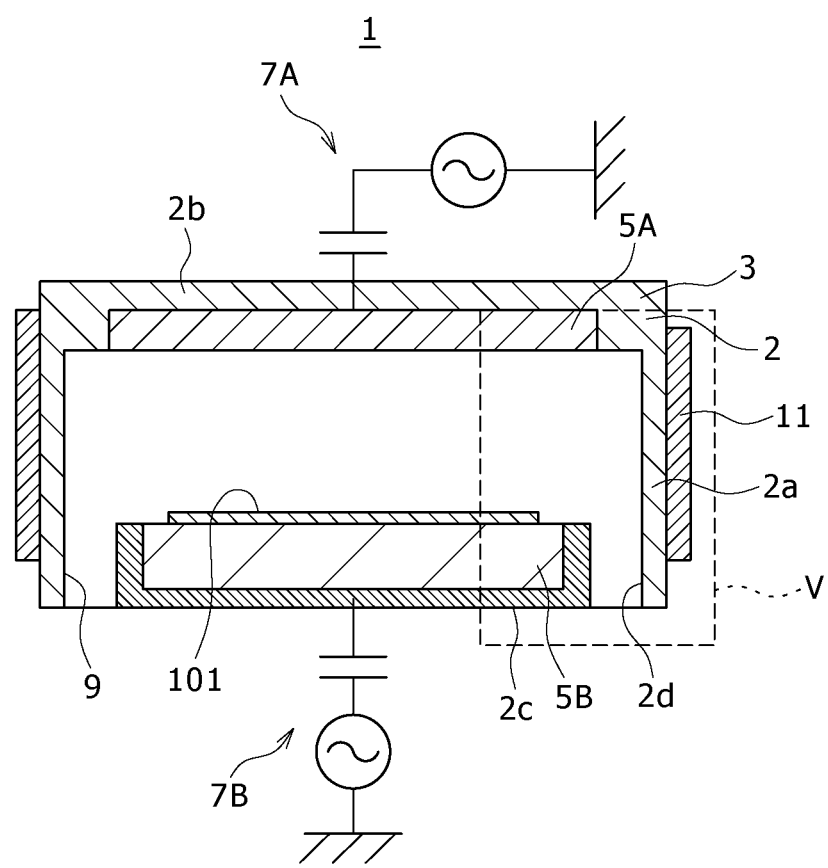

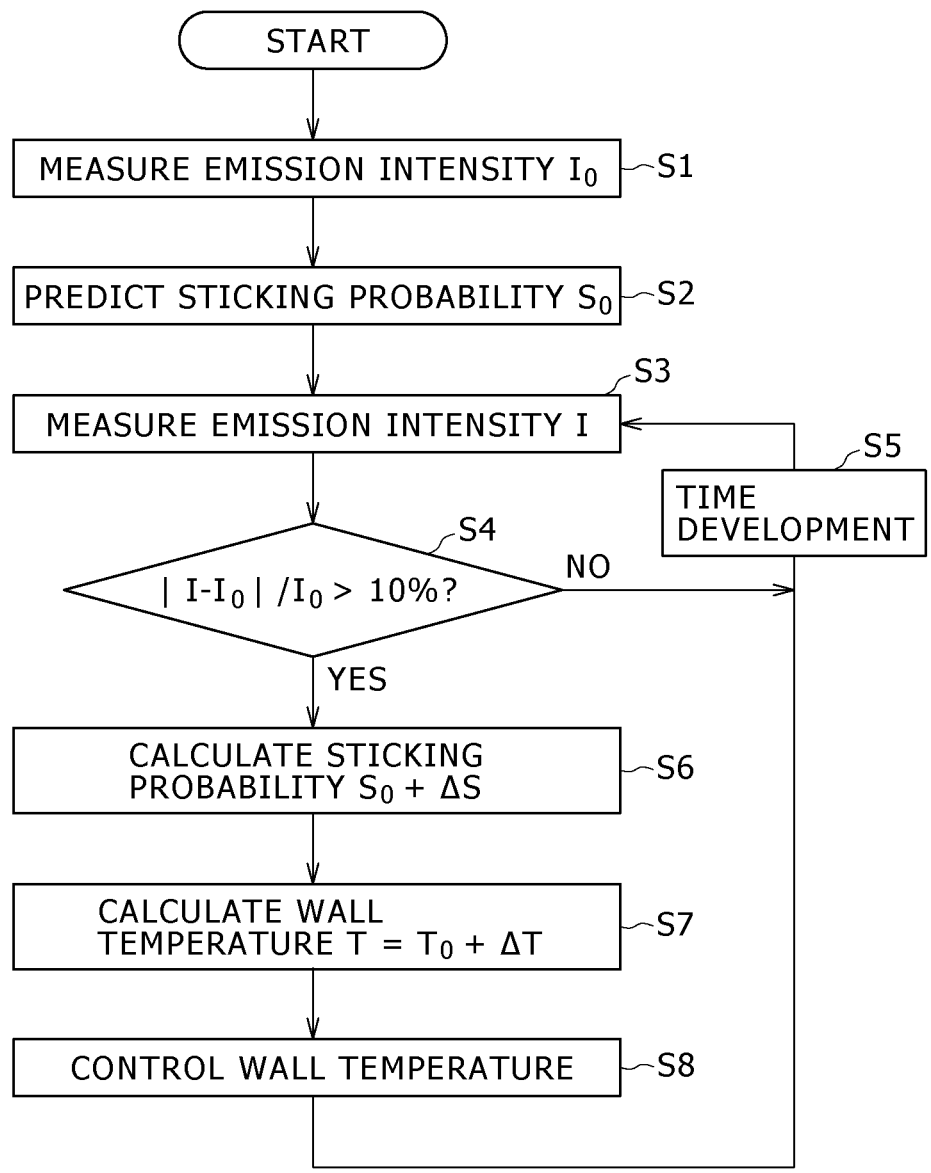

SEMICONDUCTOR MANUFACTURING DEVICE, SEMICONDUCTOR DEVICE MANUFACTURING METHOD, SIMULATION DEVICE, AND SIMULATION PROGRAM

BACKGROUND OF THE INVENTION

1. Field of the Invention

The present invention relates to a semiconductor manufacturing device, a semiconductor device manufacturing method, a simulation device, and a simulation program.

2. Description of the Related Art

It is known that in semiconductor processes using particles (gas) such as a dry etching method, a CVD (Chemical Vapor Deposition) method, a PVD (Physical Vapor Deposition) method and the like, the state of a chamber wall affects an etching rate or a deposition rate.

In view of correlation between the temperature of the chamber wall and the etching rate, Japanese Patent Laid-Open No. 2002-110635 discloses techniques for maintaining the temperature of the chamber wall at a predetermined temperature by feedback control, and thereby stabilizing etching characteristics.

In addition, Japanese Patent Laid-Open No. 2002-110635 cites, as a reason that the temperature of the chamber wall affects the etching rate, an increase in amount of sticking of particles on the chamber wall with decrease in the temperature of the chamber wall and a resulting decrease in amount of deposition of particles on a wafer.

SUMMARY OF THE INVENTION

When particles are deposited on the chamber wall and thus the heat capacity of the chamber wall is changed, the temperature of the chamber wall is changed. In addition, when particles collide with the chamber wall, the temperature of the chamber wall is changed. Thus, the temperature of the chamber wall does not necessarily represent a degree of sticking of particles on the chamber wall accurately. That is, even when the temperature of the chamber wall is maintained at a predetermined temperature, the etching rate cannot necessarily be maintained at a desired rate.

It is desirable to provide a semiconductor manufacturing device, a semiconductor device manufacturing method, a simulation device, and a simulation program that allow effects of the chamber wall to be suitably considered.

According to an embodiment of the present invention, there is provided a semiconductor manufacturing device including: a chamber in which a wafer is disposed; a sensor for detecting an index value indicating a state within the chamber; a sticking probability calculating section configured to calculate a value of a sticking probability of particles sticking to a chamber wall of the chamber on a basis of a value of the detected index value; an acting section capable of varying the sticking probability in the chamber; and a control section configured to control the acting section so that the sticking probability calculated by the sticking probability calculating section is a predetermined value.

Preferably, the semiconductor manufacturing device further includes: a particle density calculating block for calculating a particle density by performing a time development type simulation based on a differential equation of the particle density, the differential equation including a sticking probability set to each of a plurality of mesh walls set by dividing the chamber wall as a parameter; an index value calculating section configured to calculate the index value on a basis of the calculated particle density; and a storage section configured to store data retaining the sticking probability and the index value calculated by the index value calculating section, the index value being obtained from the particle density calculated by the particle density calculating block on a basis of the sticking probability, in association with each other; wherein the sticking probability calculating section calculates the value of the sticking probability corresponding to the value of the detected index value by referring to the data.

Preferably, the differential equation includes a distance between a position at which the particle density is calculated and each of the plurality of mesh walls as a parameter, the parameter being such that particle disappearance is increased as a value of the parameter is decreased.

Preferably, the particle density calculating block calculates the particle density in each of a plurality of mesh spaces set by dividing an inside of the chamber, the index value calculating section calculates an emission intensity in each of the plurality of mesh spaces on a basis of the particle density in each of the plurality of mesh spaces, and integrates the calculated emission intensity in each of the plurality of mesh spaces in a predetermined direction, whereby the index value calculating section calculates an emission intensity with the predetermined direction as a direction of a line of sight, and the sensor detects the emission intensity in the direction of the line of sight.

Preferably, the acting section has a light irradiating section configured to irradiate the chamber wall with light, and the control section controls an amount of light irradiation of the light irradiating section so that the sticking probability calculated by the sticking probability calculating section is the predetermined value.

Preferably, the acting section includes a chopper movable between a covering position to cover the wafer and a retracted position retracted from the covering position and a gas supplying section capable of supplying a predetermined gas affecting the sticking probability on an opposite side of the chopper in the covering position from the wafer within the chamber, and the control section controls an amount of supply of the predetermined gas so that the sticking probability calculated by the sticking probability calculating section is the predetermined value.

Preferably, the acting section includes a chopper movable between a covering position to cover the wafer and a retracted position retracted from the covering position and a gas supplying section capable of supplying a plurality of species of gases affecting the sticking probability on an opposite side of the chopper in the covering position from the wafer within the chamber, and the control section controls a kind of supplied gas so that the sticking probability calculated by the sticking probability calculating section is the predetermined value.

Preferably, the acting section includes an electrode forming a part of the chamber wall and a power supply section capable of applying a high-frequency voltage for generating plasma and a low-frequency voltage for controlling energy of particles to the electrode, and the control section controls a voltage value of the low-frequency voltage so that the sticking probability calculated by the sticking probability calculating section is the predetermined value.

Preferably, the acting section includes a conductivity varying section formed of a material changing in conductivity according to a voltage applied to the material and forming at least a part of the chamber wall and a power supply section capable of applying a voltage to the conductivity varying section, and the control section controls the voltage applied to the conductivity varying section so that the sticking probability calculated by the sticking probability calculating section is the predetermined value.

Preferably, the control section calculates at least one rate of an etching rate and a deposition rate on a basis of the detected index value, calculates a sticking probability when the calculated rate is made to be a predetermined rate spec, and controls the acting section so that the sticking probability calculated by the sticking probability calculating section is the sticking probability when the calculated rate is made to be the predetermined rate spec.

According to an embodiment of the present invention, there is provided a semiconductor device manufacturing method including: a step of detecting an index value indicating a state within a chamber; a step of calculating a sticking probability of particles sticking to a chamber wall of the chamber, the sticking probability corresponding to a value of the detected index value; and a step of controlling a physical quantity affecting the sticking probability so that the calculated sticking probability is a predetermined value.

According to an embodiment of the present invention, there is provided a simulation device including: a sticking probability setting section configured to set a sticking probability of particles sticking to a chamber wall to each of a plurality of mesh walls set by dividing the chamber wall; and a particle density calculating block for calculating a particle density by performing a time development type simulation based on a differential equation of the particle density, the differential equation including the sticking probability set to each of the plurality of mesh walls as a parameter.

Preferably, the simulation device further includes a rate calculating block for calculating at least one of an etching rate and a deposition rate on a basis of the calculated particle density.

According to an embodiment of the present invention, there is provided a simulation program for making a computer function as: a sticking probability setting section configured to set a sticking probability of particles sticking to a chamber wall to each of a plurality of mesh walls set by dividing the chamber wall; and a particle density calculating block for calculating a particle density by performing a time development type simulation based on a differential equation of the particle density, the differential equation including the sticking probability set to each of the plurality of mesh walls as a parameter.

According to the present invention, effects of the chamber wall can be suitably considered.

BRIEF DESCRIPTION OF THE DRAWINGS

FIG. 1 is a schematic sectional view of principal parts of an etching device according to a first embodiment of the present invention;

FIG. 8 is a flowchart of the procedure of processing performed by the etching device in FIG. 1;

DETAILED DESCRIPTION OF THE PREFERRED EMBODIMENTS

Figure 2:
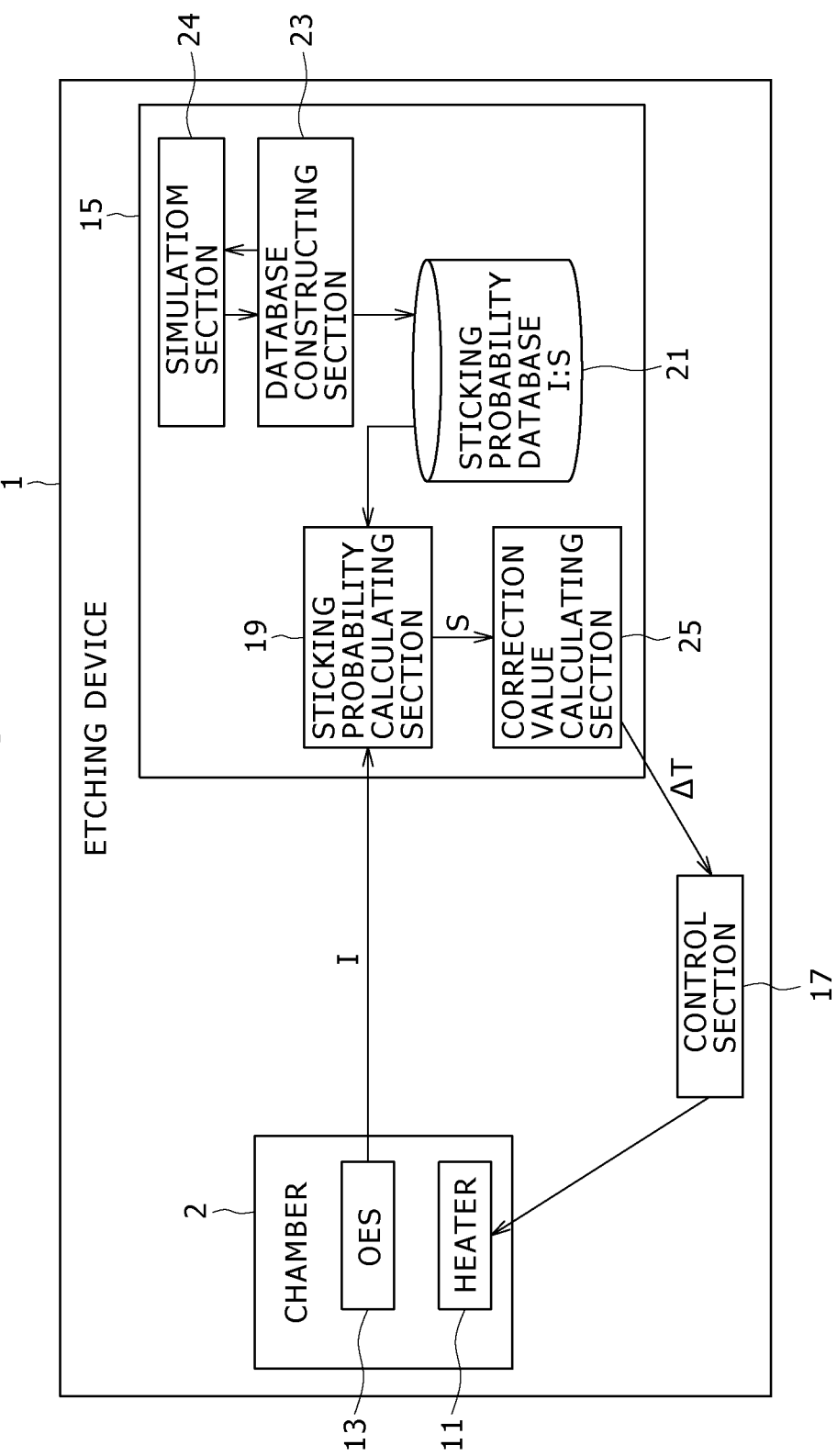
FIG. 2 is a block diagram showing a configuration of principal parts of a signal processing system of the etching device in FIG. 1.

The mode for carrying out the invention will hereinafter be described. Description will be made in the following order.
1. First Embodiment (Etching Device Controlling Sticking Probability by Temperature Control)
2. Second Embodiment (Etching Device Controlling Sticking Probability by Light Irradiation)
3. Third Embodiment (Another Etching Device Controlling Sticking Probability by Light Irradiation)
4. Fourth Embodiment (Etching Device Controlling Sticking Probability by Gas Addition)
5. Fifth Embodiment (Etching Device Controlling Sticking Probability by Bias Application)
6. Sixth Embodiment (Another Etching Device Controlling Sticking Probability by Bias Application)
7. Seventh Embodiment (Etching Device Setting Target Value of Sticking Probability Based on Rate)

Incidentally, in a second embodiment and subsequent embodiments, an identical or similar constitution to the constitution of an already described embodiment may be identified by the same reference numerals, and description thereof may be omitted.

1. First Embodiment

Constitution of Etching Device

FIG. 1 is a schematic sectional view of principal parts of an etching device 1 according to a first embodiment of the present invention.

The etching device 1 is formed by a CCP (Capacitive Coupled Plasma) type etching device that performs reactive ion etching (RIE) on a wafer 101.

The etching device 1 has a chamber 2 in which the wafer 101 is disposed. The chamber 2 is formed by a chamber base body 3 and an upper electrode 5A and a lower electrode 5B opposed to each other within the chamber base body 3 (which electrodes may hereinafter be referred to simply as an "electrode 5," and may be undistinguished from each other). The etching device 1 also has an upper power supply section 7A for applying a voltage to the upper electrode 5A and a lower power supply section 7B for applying a voltage to the lower electrode 5B (which power supply sections may hereinafter be referred to simply as a "power supply section 7," and may be undistinguished from each other).

The chamber 2 is for example formed by a side wall 2a surrounding sides of the wafer 101, a top 2b closing the side wall 2a from an upper side, and a bottom part 2c closing the side wall 2a from a lower side. The chamber 2 is also provided with a supply port not shown in FIG. 1 for supplying a gas to the inside of the chamber 2 and an exhaust port 2d for exhausting the gas within the chamber 2. The exhaust port 2d is provided in the bottom part 2c, for example.

The chamber base body 3 for example has a substantially similar shape to that of the chamber 2 and has a top, a side wall, and a bottom part. The upper electrode 5A is fixed to the top of the chamber base body 3, and the lower electrode 5B is fixed to the bottom part of the chamber base body 3.

The whole of a part that forms the chamber 2 and whose inner surface is exposed over the wafer 101 (the side wall 2a and the top 2b in the present embodiment) will be referred to as a chamber wall 9. The inner surface of the chamber wall 9 is formed by the chamber base body 3 and the electrode 5. The electrode 5 and the chamber base body 3 are formed of materials different from each other. For example, the electrode 5 is formed of Si, and the chamber base body 3 is formed of quartz ($SiO_2$). Thus, the inner surface of the chamber wall 9 is formed of partly different materials.

However, the entire inner surface of the chamber wall 9 may be formed of $SiO_2$ by forming an oxide film ($SiO_2$) on the surface of the electrode 5. In addition, the entire inner surface of the chamber wall 9 may be formed of a polymer by forming a polymer film over the surface of the electrode 5 and the surface of the chamber base body 3. That is, the entire inner surface of the chamber wall 9 may be formed of a same material.

The wafer 101 is mounted on the lower electrode 5B. When a voltage is applied to the upper electrode 5A and the lower electrode 5B, a gas over the wafer 101 becomes plasma, and the surface of the wafer 101 is etched. The gas is for example a hydrogen gas. The frequencies of the voltages applied to the upper electrode 5A and the lower electrode 5B are for example 60 MHz and 2 MHz.

The etching device 1 further has a heater 11 for controlling the temperature of the chamber wall 9. Incidentally, while FIG. 1 illustrates a case where the heater 11 is provided over the side wall 2a, the heater 11 may be provided in an appropriate position and an appropriate area of the chamber 2. In addition, a plurality of heaters 11 controlled individually may be arranged along the chamber wall 9 so that the temperature of the chamber wall 9 can be controlled locally.

FIG. 2 is a block diagram showing a configuration of principal parts of a signal processing system of the etching device 1. Incidentally, in FIG. 2, principal parts relating to control of the heater 11 are shown, and the configuration of a processing system relating to voltage application to the electrode 5 and the like are omitted.

The etching device 1 includes an OES 13 for detecting a state within the chamber 2, a simulation device 15 for calculating a control value for the heater 11 on the basis of a result of the detection, and a control section 17 for controlling the heater 11 on the basis of a result of the calculation. Incidentally, OES stands for "Optical Emission Spectrometer."

The OES 13 for example outputs emission intensity I when the inside of the chamber 2 is viewed from a direction of a predetermined line of sight. A wavelength range of detected light is for example selected appropriately from wavelength ranges where light emitted by particles greatly contributing to etching rate variation can be detected. The wavelength range may be selected appropriately from a visible light region, an ultraviolet region, an infrared region, and a submillimeter wave and millimeter wave region. The wavelength range is for example 200 nm to 800 nm. Incidentally, light emitted by hydrogen (Hα) has a wavelength of 656.3 nm.

The simulation device 15 for example calculates an amount of correction $\Delta T$ for the temperature of the chamber wall 9 (wall temperature T) on the basis of the emission intensity I, and outputs the amount of correction $T\Delta$ to the control section 17. Incidentally, the calculation of the amount of correction and the calculation of a target value are equivalent to each other, and may not hereinafter be particularly distinguished from each other. For an operation of calculating the amount of correction, the simulation device 15 includes a sticking probability calculating section 19, a sticking probability database 21, a database constructing section 23, a simulation section 24, and a correction value calculating section 25.

The sticking probability calculating section 19 calculates the sticking probability S of particles sticking to the chamber wall 9 on the basis of the emission intensity I detected by the OES 13. At this time, the sticking probability calculating section 19 refers to the sticking probability database 21.

The sticking probability database 21 retains the emission intensity I of various values in association with the sticking probability S. Thus, when the sticking probability database 21 is searched with a value of the emission intensity I as a key, a value of the sticking probability S which value corresponds to the value of the emission intensity I set as a key is identified (calculated). Incidentally, in calculating the sticking probability S, an interpolating calculation for interpolating between values retained in the sticking probability database 21 may be performed as appropriate.

The database constructing section 23 and the simulation section 24 construct the sticking probability database 21. This will be described later.

The correction value calculating section 25 calculates an amount of correction $\Delta T$ for the wall temperature T on the basis of the sticking probability S calculated by the sticking probability calculating section 19. For example, the correction value calculating section 25 calculates an amount of variation $\Delta S$ from the value of the sticking probability S obtained continuously, and calculates the amount of correction $\Delta T$ so as to eliminate the amount of variation $\Delta S$. That is, the correction value calculating section 25 calculates the amount of correction $\Delta T$ so as to hold the value of the sticking probability S constant (for example an initial value).

The control section 17 controls the heater 11 on the basis of the amount of correction $\Delta T$ calculated by the correction value calculating section 25. For example, the control section 17 performs feedback control of voltage applied to the heater 11 so as to maintain the wall temperature T detected by a temperature sensor not shown in the figures for detecting the temperature of the chamber wall 9 at a predetermined target value. The control section 17 changes the target value by the amount of correction $\Delta T$.

As described above, the etching device 1 calculates the sticking probability S of particles sticking to the chamber wall 9 in the simulation device 15, and controls the wall temperature T so that the sticking probability S is a predetermined value.

Figure 3:
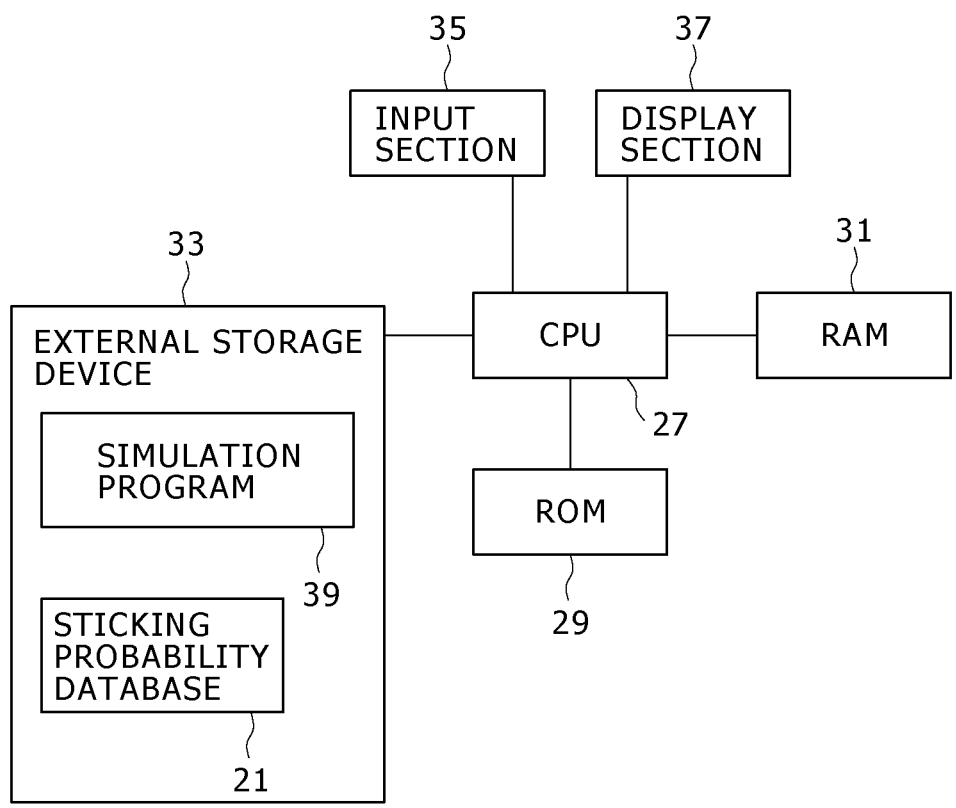
FIG. 3 is a block diagram schematically showing a hardware configuration of a simulation device shown in FIG. 2.

FIG. 3 is a block diagram schematically showing a hardware configuration of the simulation device 15.

The simulation device 15 is for example formed by a computer, which includes a CPU 27, a ROM 29, a RAM 31, an external storage device 33, an input section 35, and a display section 37.

The CPU 27 reads and executes a simulation program 39 stored in the external storage device 33. The computer thereby performs various functions as the simulation device 15. The sticking probability database 21 is stored in the external storage device 33.

Incidentally, the computer forming the simulation device 15 may be a single computer or a plurality of computers connected to each other via a network. In addition, the computer forming the simulation device 15 may be incorporated into the device having the chamber 2, or may be connected to the device via a network. When the control section 17 includes a computer, the simulation device 15 and the control section 17 may share a part of hardware.

Figure 4:
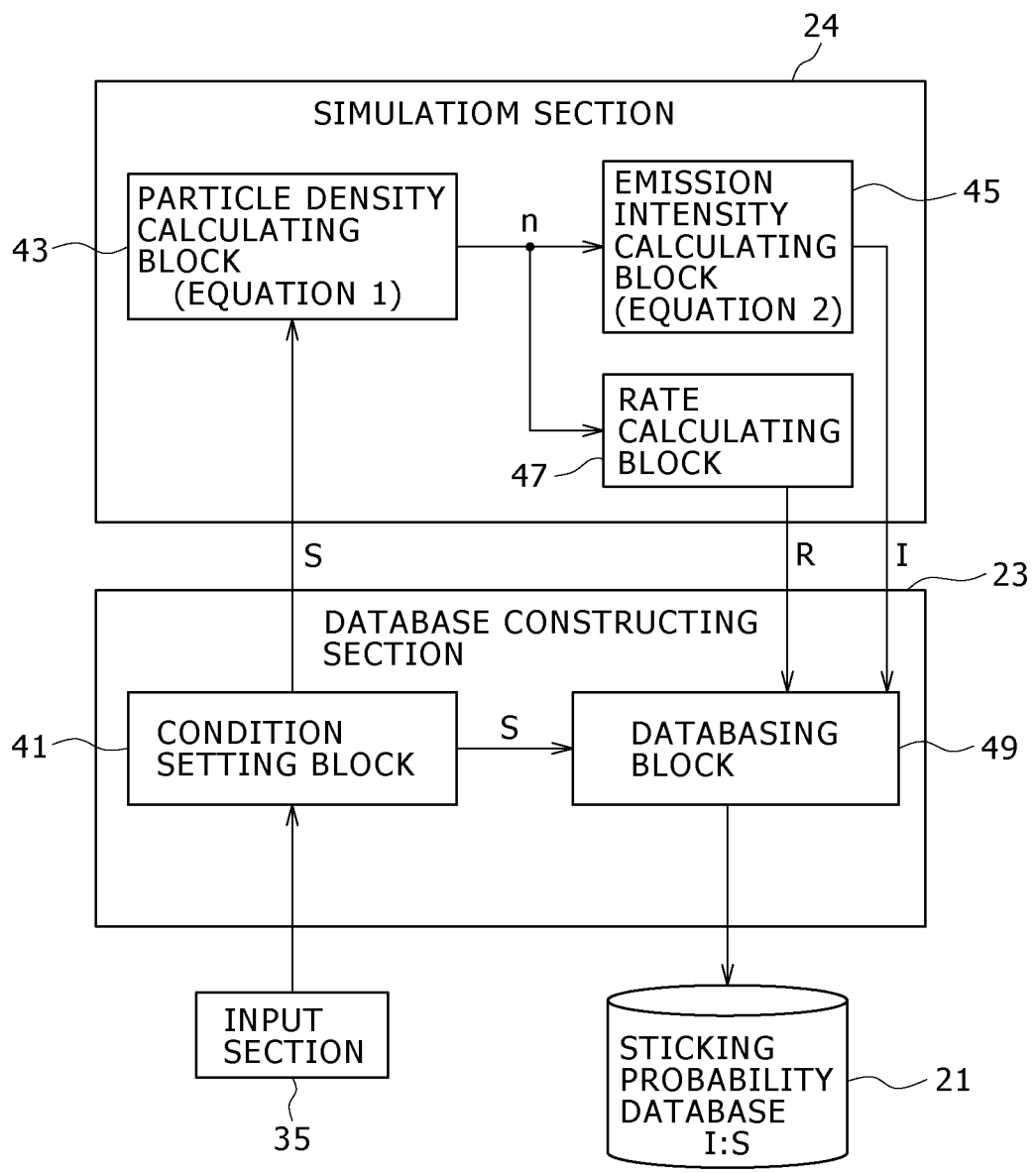
FIG. 4 is a block diagram showing a configuration of a signal processing system of a database constructing section and a simulation section shown in FIG. 3.

FIG. 4 is a block diagram showing a configuration of a signal processing system of the database constructing section 23 and the simulation section 24.

The simulation section 24 is supplied with the values of various parameters defining conditions for simulation. The various parameters include the sticking probability S of particles sticking to the chamber wall 9. The simulation section 24 then performs simulation to thereby calculate the emission intensity I within the chamber 2.

Thus, by performing simulation for a plurality of simulation cases with values of the sticking probability S which values are different from each other, the sticking probability database 21 can be constructed in which the sticking probability S of various values is associated with the emission intensity I.

In order to achieve the construction of such a sticking probability database 21, the database constructing section 23 and the simulation section 24 have the following configuration.

A condition setting block 41 in the database constructing section 23 sets the values of various parameters including the value of the sticking probability S on the basis of a signal from the input section 35. For example, the condition setting block 41 calculates and sets the sticking probability of various values on the basis of the range (for example 0 to 1) and step width (for example 0.01) of the input sticking probability S.

A particle density calculating block 43 in the simulation section 24 calculates density within the chamber 2 of particles forming the gas (particle density n) on the basis of the values of the various parameters input from the condition setting block 41. The particle density n is for example the number of particles per predetermined volume. Incidentally, as described above, the various parameters include the sticking probability S.

An emission intensity calculating block 45 in the simulation section 24 calculates the emission intensity I on the basis of the particle density n calculated by the particle density calculating block 43.

A rate calculating block 47 in the simulation section 24 calculates an etching rate R or a deposition rate R (which may hereinafter be referred to collectively as a "rate R") on the basis of the particle density n calculated by the particle density calculating block 43.

A databasing block 49 in the database constructing section 23 stores the value of the sticking probability S set by the condition setting block 41 and the values of the emission intensity I and the rate R calculated on the basis of the value of the sticking probability S in association with each other in the external storage device 33.

The sticking probability database 21 is thus constructed. Incidentally, as is understood from the above description, the sticking probability database 21 can also retrieve the sticking probability S with the rate R as a key.

As described above, the simulation section 24 first calculates the particle density n on the basis of the sticking probability S, and next calculates the emission intensity I and the rate R on the basis of the particle density n. Methods for these calculations will be described in the following.

(Particle Density Calculating Method)

The particle density calculating block 43 calculates the particle density n by performing a time development type simulation based on a differential equation of the particle density n (by solving the differential equation by simulation), which differential equation includes the sticking probability S as a parameter.

Incidentally, simulation may be performed by an appropriate method such as an Euler method, a Runge-Kutta method or the like. In addition, a time in simulation (virtual) before a solution to the differential equation is obtained is set appropriately in consideration of a time necessary for actual etching. The same is true for other simulations to be described later.

Figure 5:
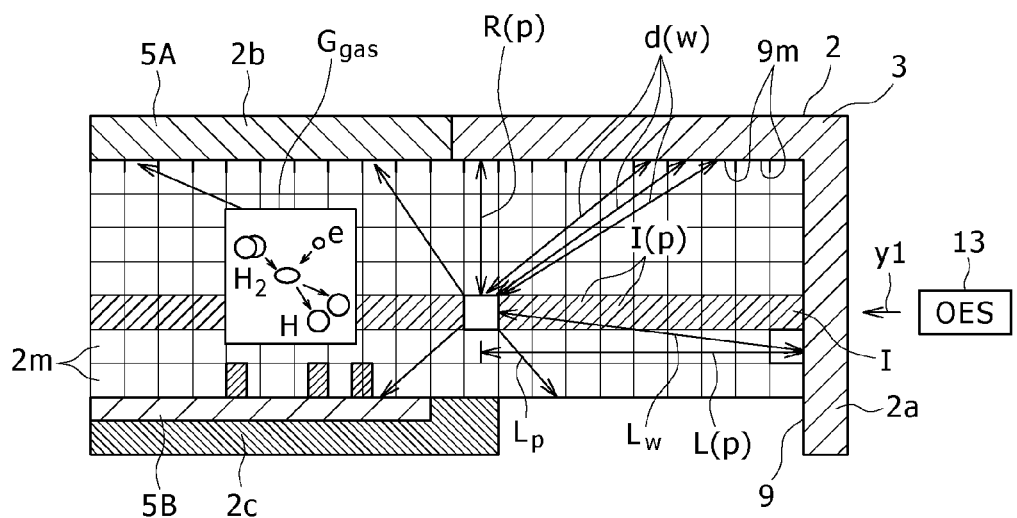
FIG. 5 is a schematic diagram of a region V in FIG. 1, the schematic diagram being of assistance in explaining a method and conditions for simulation.

FIG. 5 is a schematic diagram of a region V in FIG. 1, the schematic diagram being of assistance in explaining a method and conditions for simulation.

A plurality of mesh spaces 2*m* are set in a space within the chamber 2 by dividing the space. The calculation of particle density n, that is, simulation is performed in each of the mesh spaces 2*m*.

A plurality of mesh walls 9*m* are set in the chamber wall 9 by dividing the chamber wall 9. Sticking probability S is set to each of the mesh walls 9*m*. By setting sticking probability S to each of the mesh walls 9*m*, sticking probability S can be set appropriately according to conditions of each part of the chamber wall 9. For example, different sticking probabilities S can be set to a part formed by the chamber base body 3 ($SiO_2$) and a part formed by the electrode 5 (Si) in the chamber wall 9.

The shape and size of the mesh spaces 2*m* and the mesh walls 9*m* may be set appropriately. The (end face) shape and size of the mesh spaces 2*m* and the shape and size of the mesh walls 9*m* may be identical with each other or different from each other. The size of the mesh spaces 2*m* and the mesh walls 9*m* is for example on the order of a few mm.

Simulation may be two-dimensional simulation or three-dimensional simulation. In other words, the mesh spaces 2*m* may be set two-dimensionally or three-dimensionally, and the mesh walls 9*m* may be set one-dimensionally or two-dimensionally.

In the following, p will be set as an identifying number of a mesh space 2*m*, and (p) may be attached to a parameter (function of p) whose value changes in each of the mesh spaces 2*m*. In addition, w will be set as an identifying number of a mesh wall 9*m*, and (w) may be attached to a parameter (function of w) whose value changes in each of the mesh walls 9*m*.

In simulation, parameters indicating distances between a mesh space 2*m* and the chamber wall 9 are also taken into consideration. Specifically, a (shortest) distance L(p) between the mesh space 2*m* and the side wall 2*a*, a (shortest) distance R(p) between the mesh space 2*m* and the top 2*b*, and a distance d(w) between the mesh space 2*m* and a mesh wall 9*m* are taken into consideration. Incidentally, while d(w) is also a function of p, the addition of p is omitted. The distances L(p), R(p), and d(w) are for example distances from the central position of the mesh space 2*m*. In addition, d(w) is for example a distance from the central position of the mesh wall 9*m*.

Particle density n is calculated properly by thus taking the distances from the chamber wall 9 into consideration. In particular, particle density n is calculated properly by setting sticking probability S and distance d(w) to each of the mesh walls 9*m*.

The following Equation 1, for example, is used as the differential equation of particle density n.

$$\frac{dn(i,t)}{dt} = \sum_m k_m n(i,t) n(j,t) - \frac{n(i,t)}{\tau_r} - \frac{n(i,t)}{\tau_n} \quad \text{[Equation 1]}$$

$$\frac{1}{\tau_n} = \sum_w \frac{S(w) v_r}{2d(w)(2-S(w))} + \frac{1}{\tau_D}$$

$$\tau_D = \frac{P\Lambda^2}{D}$$

$$D = \mu \frac{kT_e}{e}$$

$$\frac{1}{\Lambda^2} = \left(\frac{\pi}{L(p)}\right)^2 + \left(\frac{2.405}{R(p)}\right)^2$$

As described above, Equation 1 is used for each of the mesh spaces $2m$. $n(i, t)$ and $n(j, t)$ are particle densities of particles of kinds i and j at time t. The kind i (j) of particles is for example H, $H_2$, $H^+$, $H_2^+$, $H_3^+$, or e when the gas is hydrogen. In the following, H, $H_2$ or the like may be shown in ( ) in place of i or j.

km is a reaction rate, τt is an exhaust characteristic time, and τn is a wall disappearance characteristic time. $v_r$ is particle velocity, D is a diffusion constant, P is pressure, μ is mobility, k is a Boltzmann constant, Te is electron temperature, and e is an elementary charge.

In an equation of a first row of Equation 1, a first term represents density change due to formation and disappearance of particles as a result of collision reaction between particles (see Gg in FIG. 5). A second term represents density change due to discharge of particles from the chamber 2 (see Lp in FIG. 5). A third term represents density change due to interaction between particles and the chamber wall 9 and disappearance of particles on the wafer 101 (see Lw in FIG. 5).

As shown in the equation of the first row and an equation of a second row of Equation 1, distance d(w) is incorporated into Equation 1 such that particle disappearance is increased as the value of the distance d(w) between the mesh space $2m$ and the mesh wall $9m$ is decreased.

(Emission Intensity Calculating Method)

The emission intensity calculating block 45 first calculates the particle density n (H*) of a particle H* contributing to light emission on the basis of the particle density n(i) calculated by the particle density calculating block 43. Incidentally, H* is a different concept from the kinds of particles such as H, $H_2$ and the like (kinds i and j in Equation 1), and the particle density n (H*) cannot be obtained from Equation 1.

Specifically, the emission intensity calculating block 45 calculates the particle density n (H*) by solving a differential equation of the particle density n (H*) through simulation, which differential equation includes the particle density n(i) obtained from Equation 1 as a parameter. The simulation is performed for each of the mesh spaces $2m$ as with simulation based on Equation 1.

The emission intensity calculating block 45 next calculates the emission intensity I(p) of each of the mesh spaces $2m$ on the basis of the particle density n (H*) of each of the mesh spaces $2m$. Then, as shown by hatching in FIG. 5, the emission intensity calculating block 45 integrates the emission intensity I(p) of each of the mesh spaces $2m$ in a direction of a predetermined line of sight y1, and thereby calculates emission intensity I when the chamber 2 is viewed in the direction of the line of sight y1.

By thus calculating the emission intensity I in the direction of the line of sight y1, the emission intensity I in the direction of the line of sight y1 which intensity is detected by the OES 13 can be reproduced. Incidentally, the direction of the line of sight y1 may be set as an appropriate direction such as a horizontal direction, a vertical direction, directions inclined to the horizontal direction and the vertical direction, a direction of arrangement of the mesh spaces $2m$, a direction inclined to the direction of arrangement of the mesh spaces $2m$, or the like. In addition, the cross-sectional area of the integrated spaces in the direction of the line of sight y1 may also be set appropriately. The position of the integrated spaces which position is in a direction orthogonal to the direction of the line of sight y1 may be set appropriately, and emission intensity I in the direction of the line of sight y1 may be calculated at a plurality of positions.

The emission intensity calculating block 45 calculates the emission intensity I on the basis of the particle density n(i) using the following equation, for example.

$$\frac{dn(H^*)}{dt} = K_\alpha n_e n(H) + K_m n_e n(H_2) - \frac{n(H^*)}{\tau'} \quad \text{[Equation 2]}$$

$$I_r = n(H^*) h \nu A \beta_{esc} \left( \frac{S_f(v) - P_b(v)}{S_f(v)} \right)$$

$$I[H] = \sum_r I_r[H]$$

where Kα is a reaction rate, ne is electron density (n(e)), τ' is an emission lifetime, h is a Planck constant, ν is frequency, A is Einstein's coefficient, β is an escape ratio, $S_f$ is a source function, and $P_b$ is an amount of background thermal radiation. Incidentally, the escape ratio β may usually be set to be one or lower in the chamber used in a semiconductor process.

A first row of Equation 2 is the differential equation of particle density n (H*). A second row is an equation for calculating the emission intensity I(p) of each of the mesh spaces $2m$ on the basis of the particle density n (H*) of each of the mesh spaces $2m$. A third row is an equation for calculating emission intensity I in the direction of the line of sight y1 on the basis of the emission intensity I(p) of each of the mesh spaces $2m$.

(Rate Calculating Method)

The rate calculating block 47 for example calculates an etching rate R or a deposition rate R by an equation including the particle density n calculated by the particle density calculating block 43 as a parameter. An equation described in the following documents, for example, may be used.

Japanese Patent Laid-Open No. 2009-152269

Sixteenth Plasma Electronics Seminar Text "Fundamentals for Practical Plasma Process Construction and Front Lines of Application," written by Koichi Ono, published by the Division of Plasma Electronics of the Society of Applied Physics, issued on Oct. 27, 2005

In addition, for example, correlation data between the particle density n and the rate R may be prepared in advance so that the rate calculating block 47 refers to the correlation data to calculate the value of the rate R corresponding to the value of the particle density n calculated by the particle density calculating block 43.

Figure 6:
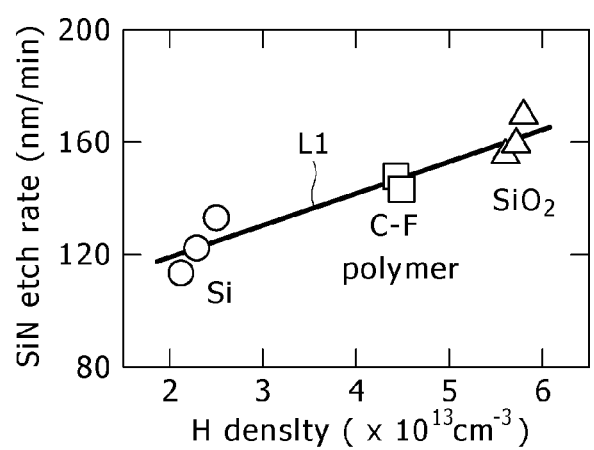
FIG. 6 shows an example of data representing correlation between particle density and an etching rate.

FIG. 6 shows an example of data (map) representing the correlation between the particle density n and the etching rate R. The axis of abscissas indicates the particle density n, and the axis of ordinates indicates the etching rate R. In addition, a straight line L1 represents the correlation between the particle density n and the etching rate R. In FIG. 6, actually measured values of the particle density n and the etching rate R when the chamber wall 9 is formed of Si, a polymer, or $SiO_2$ are also plotted.

(Simulation Calculation Example)

FIGS. 7A to 7D are diagrams of assistance in explaining an example of calculation in simulation. In FIGS. 7A to 7D, an axis of abscissas indicates distance from the center of the wafer, and an axis of ordinates indicates the etching rate.

Figure 7A:
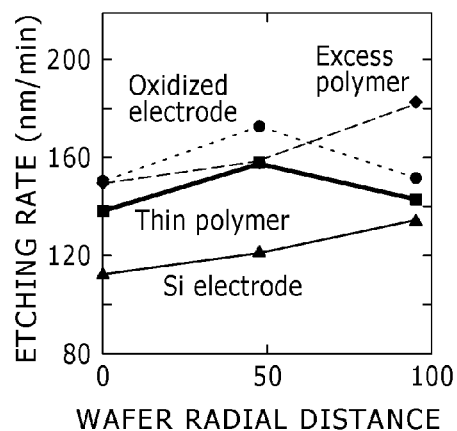
FIGS. 7A, 7B, 7C, and 7D are diagrams of assistance in explaining an example of calculation in simulation.

FIG. 7A shows actually measured values of the etching rate (Fukasawa et. al Jpn. J. Appl. Phys. 48 (2009) 08HC01). The actually measured values when the chamber wall is formed of Si, a thin polymer, a thick polymer, and $SiO_2$ are each shown.

Figure 7B:
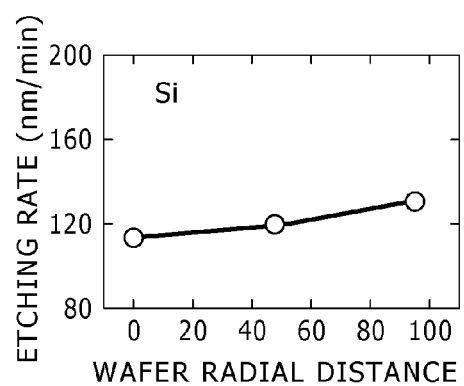
Figure 7C:
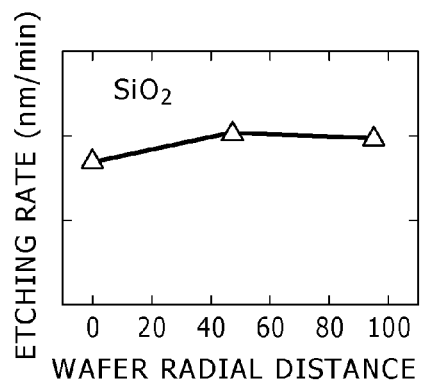
Figure 7D:
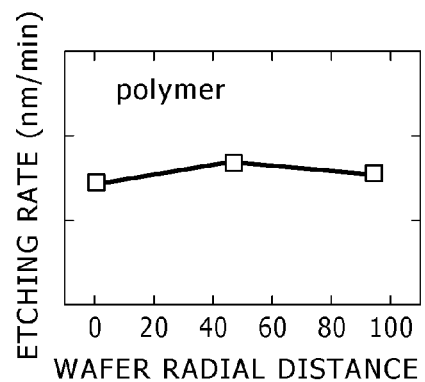

On the other hand, FIGS. 7B to 7D show simulation results. FIGS. 7B to 7D represent cases where the chamber wall 9 is formed of Si, $SiO_2$, or a polymer, respectively.

As is understood from comparison of FIG. 7A with FIGS. 7B to 7D, distributions of the etching rate R can be calculated properly by appropriately setting sticking probability S according to the material of the chamber wall 9.

Simulation conditions of FIGS. 7B to 7D are shown in the following.

Simulation Conditions:
Gas species: hydrogen, electron density: 5 eV, ion temperature: 1000 K, neutral particle temperature: 400 K, central electron density: $10^{10}/cm^3$, chamber volume: 10 liters, chamber radius: 300 mm, chamber gap: 35 mm, upper electrode radius: 150 mm, wafer aperture ratio: 100, Si electrode sticking probability after cleaning: 0.5, side wall $SiO_2$ sticking probability after cleaning: 0.06, sticking probability of polymer film: 0.10, pressure: 30 mT, total gas flow rate: 300 sccm, and etching equivalent time: 30 seconds.

(Correction Value Calculating Method)

The correction value calculating section 25 for example calculates an amount of correction $\Delta T$ referring to data associating the sticking probability S with the wall temperature T or data associating the amount of variation $\Delta S$ of the sticking probability with the amount of correction $\Delta T$. The amount of correction $\Delta T$ may be calculated on the basis of a calculating equation. The temperature dependence of the sticking probability S is obtained by for example actual measurement or MD (Molecular Dynamics) calculation.

Incidentally, the correction value calculating section 25 can also calculate the sticking probability S on the basis of the wall temperature T by referring to for example the data associating the sticking probability S with the wall temperature T.

(Operation of Etching Device)

FIG. 8 is a flowchart of the procedure of processing performed by the etching device 1. This processing is performed simultaneously with a start of a process.

In step S1, the etching device 1 measures an emission intensity $I_0$ at a time of the start of the process by the OES 13, and stores the emission intensity $I_0$. In addition, at this time, the etching device 1 measures a wall temperature $T_0$ at the time of the start of the process by a temperature sensor not shown in the figures, and stores the wall temperature $T_0$.

In step S2, the etching device 1 calculates a sticking probability $S_0$ at the time of the start of the process on the basis of the emission intensity $I_0$ obtained in step S1 in the sticking probability calculating section 19. In addition, the etching device 1 calculates a sticking probability $S_0'$ on the basis of the wall temperature $T_0$ using a part of functions of the correction value calculating section 25.

Incidentally, the sticking probability $S_0$ and the sticking probability $S_0'$ do not necessarily coincide with each other because conditions when the sticking probability database 21 is constructed and conditions when the temperature dependence of the sticking probability S on the wall temperature T (data associating the sticking probability S with the wall temperature T, for example) is obtained are different from each other.

In step S3, the etching device 1 measures a present emission intensity I by the OES 13.

In step S4, the etching device 1 determines whether the absolute value $|I-I_0|$ of a difference between the present emission intensity I and the initial value of the emission intensity $I_0$ exceeds a predetermined permissible value. The permissible value is for example a value of 10% of the emission intensity $I_0$.

When it is determined that $|I-I_0|$ exceeds the permissible value, the process proceeds to step S6. When it is determined that $|I-I_0|$ is not higher than the permissible value, the process skips steps S6 to S8 and returns to step S3. At this time, time adjustment is made so that measurement (step S3) is repeatedly performed at predetermined intervals (for example 5s) (step S5).

In step S6, the etching device 1 calculates a sticking probability S ($S_0+\Delta S$) corresponding to the emission intensity I obtained in step S3 in the sticking probability calculating section 19.

In step S7, the etching device 1 calculates a wall temperature T ($T_0+\Delta T$) for returning the sticking probability S ($S_0+\Delta S$) to $S_0$ in the correction value calculating section 25. For example, the calculation is performed as follows.

First, the correction value calculating section 25 calculates an amount of variation $\Delta S$ of sticking probability from the sticking probability $S_0$ obtained in step S2 and the sticking probability S obtained in step S6. Next, the correction value calculating section 25 calculates $S_0'+\Delta S$ from the sticking probability $S_0'$ obtained in step S2 and the amount of variation $\Delta S$. Next, the correction value calculating section 25 calculates a wall temperature T ($T_0+\Delta T$) corresponding to $S_0'+\Delta S$. Then, the correction value calculating section 25 calculates an amount of correction $\Delta T$ on the basis of the calculated wall temperature T and the wall temperature $T_0$ obtained in step S1.

In step S8, the etching device 1 controls the heater 11 so as to change the temperature by the value of correction $\Delta T$ calculated in step S7. The process thereafter returns to step S3 after predetermined time adjustment is made (step S5).

Incidentally, as described above, in simulation, the sticking probability S is set to each of the plurality of mesh walls 9m. The wall temperature T ($T_0+\Delta T$) may be calculated so that the sticking probabilities S(w) at the plurality of mesh walls 9m each return to an initial value, or so that a representative value such as an average value or the like of the sticking probabilities S(w) returns to an initial value. In addition, the database may retain the sticking probabilities S(w) of all the mesh walls 9m, or retain the representative value of the sticking probabilities S(w).

In step S7 (correction value calculating section 25), only the wall temperature T ($T_0+\Delta T$) corresponding to $S_0'+\Delta S$ may be calculated without the value of correction $\Delta T$ being calculated. That is, only a new target value of the wall temperature T may be calculated. Then, the control section 17 may perform feedback control of the wall temperature T on the basis of the new target value. In other words, division of functions between the simulation device 15 and the control section 17 may be set appropriately.

Incidentally, a range of temperature correction when SiN etching was performed under simulation conditions illustrated in the description of FIGS. 7A to 7D and cleaning conditions and etching conditions illustrated in the following was 60° C. to 70° C.

Cleaning Conditions:
Pressure: 150 mT, upper application power: 2000 W, lower application power: 1000 W, gas system: $O_2$=1000 sccm, wall temperature: 60/60/20° C., and processing time: 180 seconds.
Etching Conditions:
Pressure: 30 mT, upper application power: 1000 W, lower application power: 300 W, gas system: $CH_2F_2/O_2/Ar$=40/30/200 sccm, and wall temperature: upper part/side wall=60/60° C.

According to the above embodiment, the etching device 1 has the chamber 2 in which the wafer 101 is disposed and the OES 13 for detecting the emission intensity I as an index value indicating a state within the chamber 2. The etching device 1 also has the sticking probability calculating section 19 for calculating the value of the sticking probability S of particles sticking to the chamber wall 9 of the chamber 2 on the basis of the value of the detected emission intensity I and the heater 11 capable of varying the sticking probability S in the chamber 2. The etching device 1 further has the control section 17 for controlling the heater 11 so that the sticking probability S calculated by the sticking probability calculating section 19 is the initial value $S_0$.

The etching device 1 can therefore maintain the chamber wall 9 in a desired state and stabilize an etching rate by controlling the sticking probability S. As a result, semiconductor devices of good quality can be produced stably.

The etching device 1 further has the particle density calculating block 43, the emission intensity calculating block 45, and the external storage device 33 storing the sticking probability database 21. The particle density calculating block 43 calculates the particle density n by performing a time development type simulation based on a differential equation (Equation 1) of the particle density n, which differential equation includes the sticking probability S(w) set to each of the plurality of mesh walls 9m set by dividing the chamber wall 9 as a parameter. The emission intensity calculating block 45 calculates the emission intensity I on the basis of the calculated particle density n. The sticking probability database 21 retains the sticking probability S and the emission intensity I calculated by the emission intensity calculating block 45, which emission intensity I is obtained from the particle density n calculated by the particle density calculating block 43 on the basis of the sticking probability S, in association with each other. Then, the sticking probability calculating section 19 calculates the value of the sticking probability S corresponding to the value of the detected emission intensity I by referring to the sticking probability database 21.

Thus, the particle density calculating block 43 and the emission intensity calculating block 45 can appropriately set the sticking probability S(w) according to the constitution of the chamber wall 9, and calculate the emission intensity I. As a result, the sticking probability calculating section 19 can properly calculate the sticking probability S (which may be a plurality of sticking probabilities S(w) or a representative value of the sticking probabilities S(w)) on the basis of the emission intensity I.

The differential equation (Equation 1) of the particle density n includes a distance d(w) between a position where the particle density n is calculated (mesh space 2m) and each of the plurality of mesh walls 9m as a parameter, the parameter being such that particle disappearance is increased as the value of the parameter is decreased. Thus, effect of the sticking probability S(w) set to each of the plurality of mesh walls 9m can be suitably considered.

The particle density calculating block 43 calculates a particle density n(p) in each of the plurality of mesh spaces 2m set by dividing the inside of the chamber 2. The emission intensity calculating block 45 calculates an emission intensity I(p) of each of the plurality of mesh spaces 2m on the basis of the particle density n(p) of each of the plurality of mesh spaces 2m, and calculates the emission intensity I by integrating the emission intensities I(p) in the direction of the line of sight y1. The OES 13 detects the emission intensity I in the direction of the line of sight y1.

Thus, the sticking probability S and the detected value of the OES 13, which is easily applied to the etching device 1, can be associated with each other. As a result, a constitution for monitoring the sticking probability S is simplified.

Incidentally, in the above embodiment, the etching device 1 is an example of a semiconductor device according to the present invention. The emission intensity I is an example of an index value according to the present invention. The OES 13 is an example of a sensor according to the present invention. The heater 11 is an example of an acting part according to the present invention. The sticking probability $S_0$ is an example of a predetermined value according to the present invention. The emission intensity calculating block 45 is an example of an index value calculating section according to the present invention. The external storage device 33 is an example of a storage section according to the present invention. The condition setting block 41 is an example of a sticking probability setting section according to the present invention. The wall temperature T is an example of a physical quantity affecting sticking probability according to the present invention.

2. Second Embodiment

Figure 9:
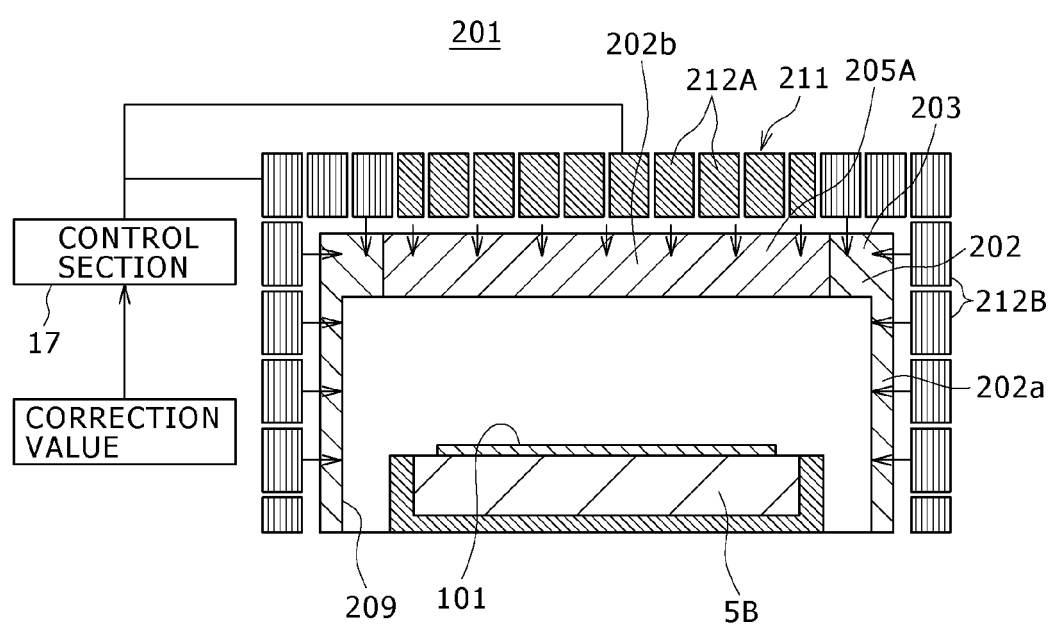
FIG. 9 is a conceptual diagram of an etching device according to a second embodiment of the present invention.

FIG. 9 is a conceptual diagram of an etching device 201 according to a second embodiment of the present invention.

The etching device 201 is different from the first embodiment in that the etching device 201 has an irradiating device 211 for applying light in place of the heater 11 as an acting part for controlling sticking probability S. In addition, a chamber 202 of the etching device 201 is different from the chamber 2 according to the first embodiment in that not only the inside part but also the outside part of a top 202b of the chamber 202 is formed by an upper electrode 205A.

The irradiating device 211 for example has a plurality of irradiation ray sources 212A and 212B (A and B may be omitted in the following) arranged so as to surround the outside of the chamber 202. The irradiation ray sources 212 are for example arranged so as to be opposed to the top 202b and a side wall 202a at intervals of 20 mm.

The irradiation ray sources 212A are arranged so as to be opposed to the upper electrode 205A. The irradiation ray sources 212A irradiate the upper electrode 205A with infrared rays (having a wavelength of 1100 nm, for example). The irradiation ray sources 212B are arranged so as to be opposed to a chamber base body 203. The irradiation ray sources 212B irradiate the upper electrode 205A with ultraviolet rays (having a wavelength of 150 nm, for example).

The configuration and operation of a signal processing system of the etching device 201 are substantially similar to the configuration and operation of the signal processing system of the etching device 1 described with reference to FIGS. 2 to 8. However, whereas the correction value calculating section 25 in the first embodiment calculates a correction value ΔT for the wall temperature T, a correction value calculating section 25 in the second embodiment calculates a correction value ΔF for an amount of light irradiation F. In addition, a control section 17 controls the irradiating device 211 so as to change the amount of light irradiation F of the irradiating device 211 by the correction value ΔF.

According to the above embodiment, the etching device 201 has the irradiating device 211 for irradiating a chamber wall 209 with light as an acting part capable of varying sticking probability S in the chamber 202. The control section 17 controls the amount of light irradiation F of the irradiating device 211 according to variation in sticking probability S calculated by a sticking probability calculating section 19.

The chamber wall 209 when irradiated with light increases in temperature and changes in particle sticking probability. Thus, as in the first embodiment, it is possible to maintain the chamber wall 209 in a desired state and stabilize an etching rate by controlling the sticking probability S. As a result, semiconductor devices of good quality can be produced stably.

In addition, because wavelengths capable of increasing the temperature efficiently are selected according to the materials of the chamber wall 209, and light of the wavelengths different from each other is applied, sticking probability S on the chamber wall 209 can be controlled more effectively.

Because the irradiating device 211 has the plurality of irradiation ray sources 212 arranged so as to surround the chamber, the sticking probability S can be controlled locally by individual control of the plurality of irradiation ray sources 212.

Incidentally, the wavelength range of light applied from the irradiating device 211 may be any wavelength region. In addition, the wavelength range does not need to be changed according to the materials. A chamber 2 of a similar constitution to that of the first embodiment may be used also in the second embodiment.

3. Third Embodiment

Figure 10:
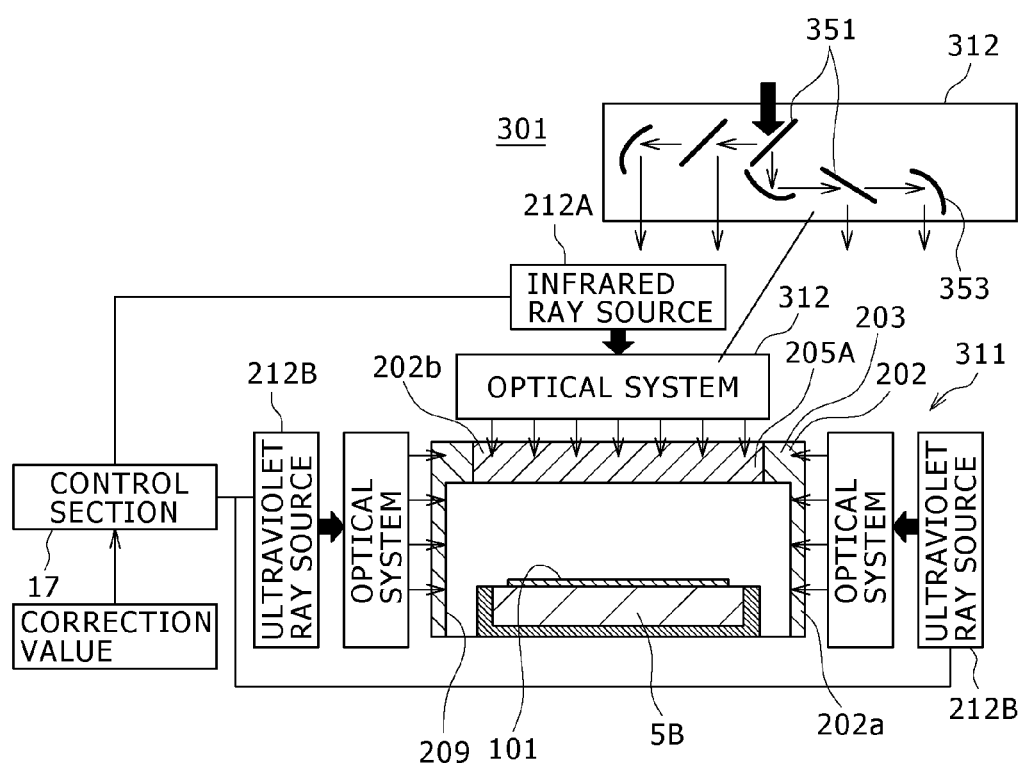
FIG. 10 is a conceptual diagram of an etching device according to a third embodiment of the present invention.

FIG. 10 is a conceptual diagram of an etching device 301 according to a third embodiment of the present invention.

As with the etching device 201 according to the second embodiment, the etching device 301 has an irradiating device 311 for irradiating a chamber wall 9 with light. In the second embodiment, the irradiating device 211 has the plurality of irradiation ray sources 212 surrounding the chamber wall 209, whereby sticking probability S can be controlled locally. In the third embodiment, on the other hand, the irradiating device 311 has an optical system 312 between the irradiation ray sources 212 and the chamber wall 209 to control the sticking probability S of the chamber wall 209 locally.

The optical system 312 for example has a plurality of reflecting mirrors 353 and half-silvered mirrors 351. An amount of irradiation can be controlled for each part by providing a gradient to the transmittance of the half-silvered mirrors 351 in a radial direction of the chamber. Further, control accuracy can be adjusted by the number of mirrors.

The above embodiment provides similar effects to those of the first and second embodiments.

4. Fourth Embodiment

Figure 11A:
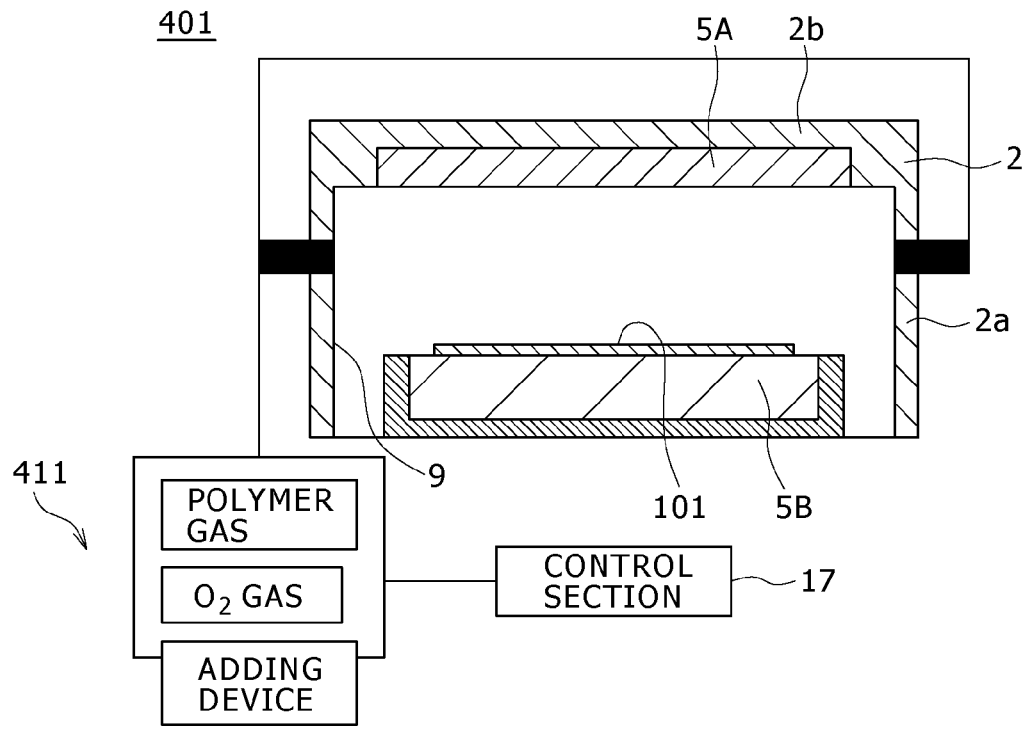
FIGS. 11A and 11B are conceptual diagrams of an etching device according to a fourth embodiment of the present invention.
Figure 11B:
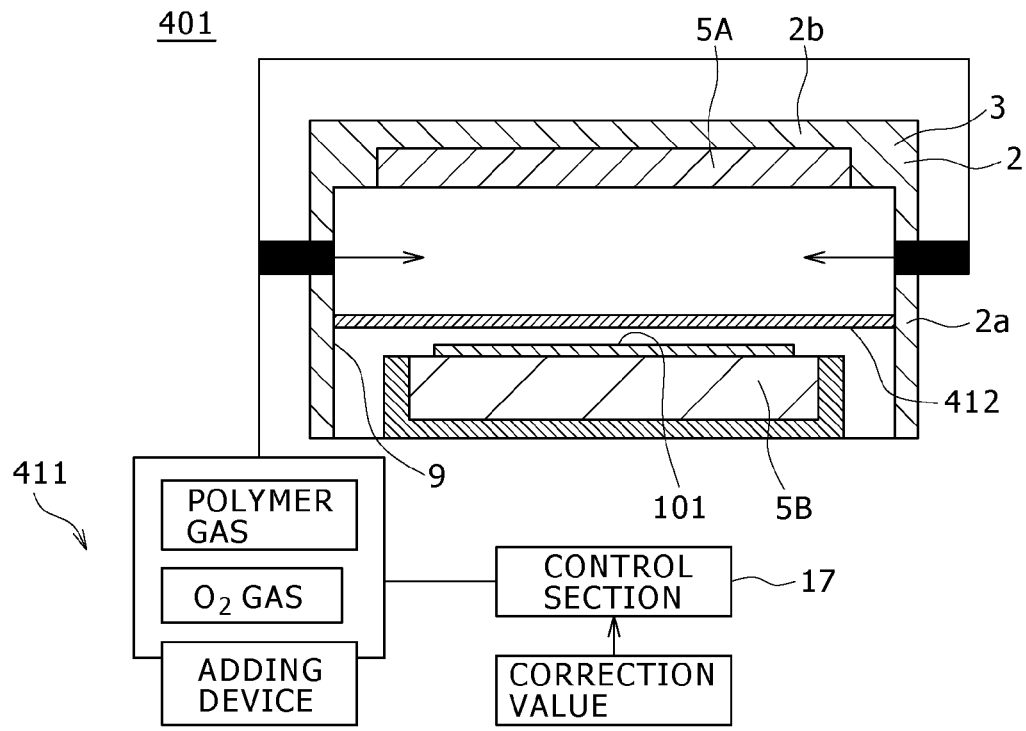

FIG. 11A and FIG. 11B are conceptual diagrams of an etching device 401 according to a fourth embodiment of the present invention.

The etching device 401 is different from the first embodiment in that the etching device 401 has a gas adding device 411 and a chopper 412 as an acting part for controlling sticking probability S in place of the heater 11.

The gas adding device 411 can supply a plurality of different species of gases different from a gas for etching, which gases affect the sticking probability S, to the inside of the chamber 2. The plurality of species of gases is for example a polymer gas and an $O_2$ gas. The polymer gas decreases the sticking probability S on an upper electrode 5A. On the other hand, the $O_2$ gas increases the sticking probability S on the upper electrode 5A.

The chopper 412 can be moved between a covering position (FIG. 11B) for covering the wafer 101 and a retracted position (not shown) (see FIG. 11A) where the chopper 412 is retracted from the covering position. The radius of the chopper 412 is for example 250 mm (the radius of the chamber is 300 mm). A distance between the wafer 101 and the chopper 412 in the covering position is for example 5 mm. A gas of the gas adding device 411 is supplied above the chopper 412 in the covering position (on an opposite side from the wafer 101), as shown in FIG. 11B.

Figure 12:
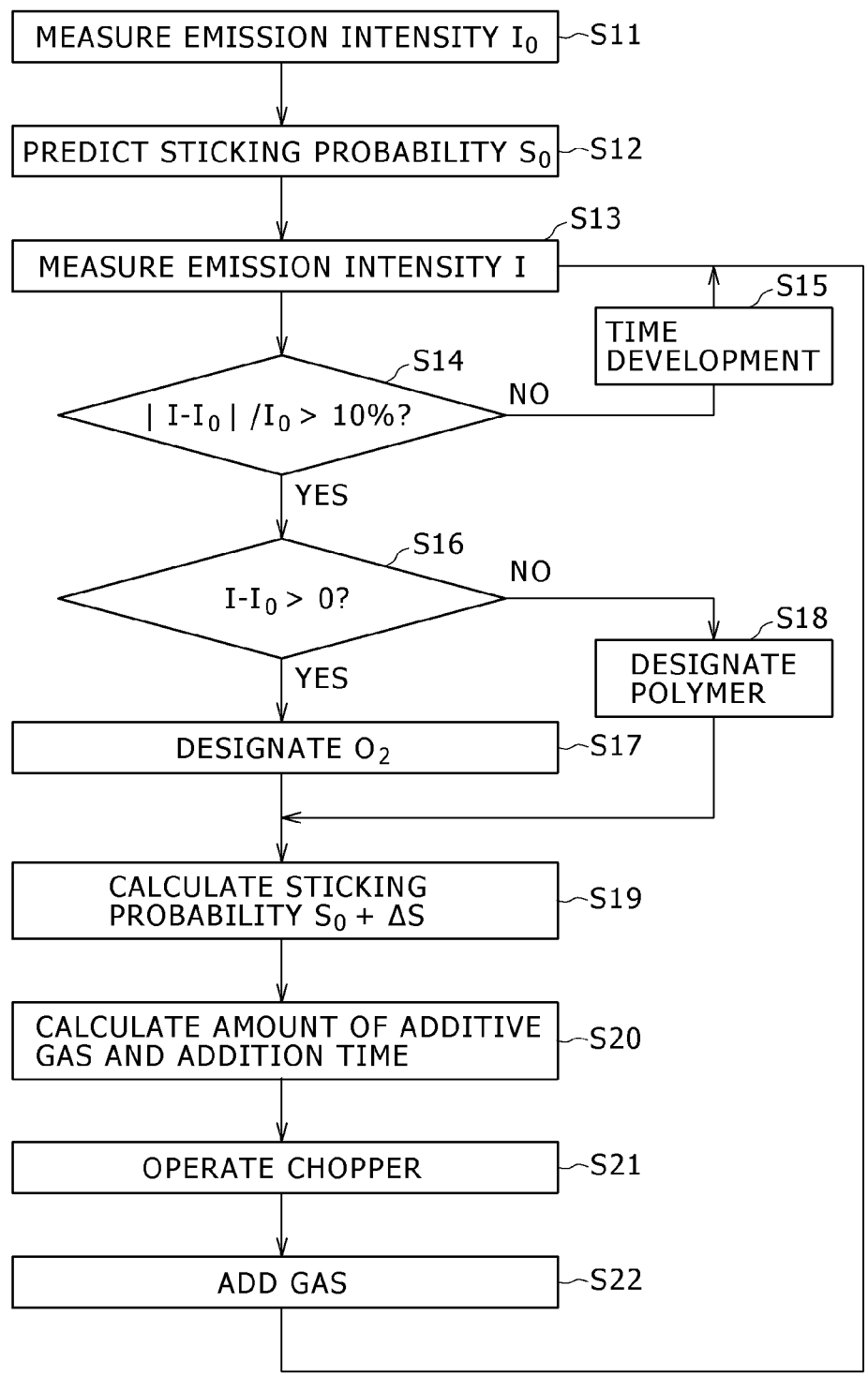
FIG. 12 is a flowchart of the procedure of processing performed by the etching device in FIG. 11.

FIG. 12 is a flowchart of the procedure of processing performed by the etching device 401. As with the processing of FIG. 8, this processing is performed simultaneously with a start of a process.

Steps S11 to S15 are similar to steps S1 to S5 in FIG. 8.

In step S16, a simulation device 15 determines whether an amount of variation $\Delta I$ ($I-I_0$) of emission intensity is a positive quantity or a negative quantity. When determining that the amount of variation $\Delta I$ is a positive quantity, the simulation device 15 designates the $O_2$ gas as a gas to be supplied to the chamber 2 (step S17). When determining that the amount of variation $\Delta I$ is a negative quantity, on the other hand, the simulation device 15 designates the polymer gas as a gas to be supplied to the chamber 2 (step S18).

In step S19, as in step S6 in FIG. 8, a sticking probability $S_0 + \Delta S$ is calculated.

In step S20, which corresponds to step S7 in FIG. 8, a control value for returning the sticking probability $S_0 + \Delta S$ to a sticking probability $S_0$ is calculated. However, in step S20, an amount (flow rate) F of additive gas and an addition time t for returning the sticking probability $S_0 + \Delta S$ to the sticking probability $S_0$ are calculated.

In step S21, a control section 17 moves the chopper 412 to a position over the wafer 101. Then, in step S22, the control section 17 controls the gas adding device 411 so as to supply the gas designated in step S17 or step S18 to the inside of the chamber 2 in the gas amount F and the addition time t calculated in step S20.

Thereafter, the control section 17 retracts the chopper 412 from the position over the wafer 101, and resumes a processing process. The process then returns to step S13.

Incidentally, an example of conditions for gas addition is shown in the following.

$O_2$ Addition
  Addition time: 30 seconds, pressure: 150 mT, upper bias: 2000 W, and flow rate: 1000 sccm
Polymer (C4F8/Ar) Addition
  Addition time: 30 seconds, pressure: 20 mT, upper bias: 2000 W, and flow rate: C4F8/Ar=15/700 sccm The above embodiment provides similar effects to those of the first embodiment. That is, it is possible to maintain the chamber wall 9 in a desired state and stabilize an etching rate by controlling sticking probability S. As a result, semiconductor devices of good quality can be produced stably.

Incidentally, at least one of the flow rate and the addition time may be controlled with one kind of gas provided, or only selection of a kind of gas may be made with the flow rate and the addition time fixed.

5. Fifth Embodiment

Figure 13:
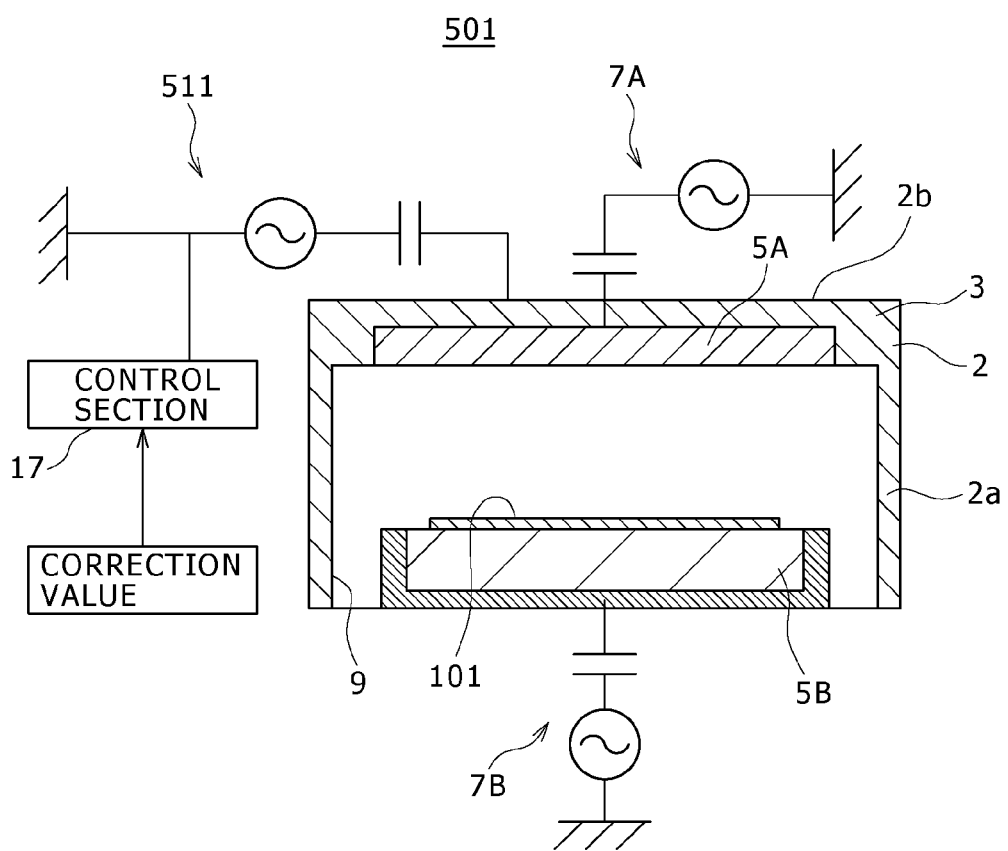
FIG. 13 is a conceptual diagram of an etching device according to a fifth embodiment of the present invention.

FIG. 13 is a conceptual diagram of an etching device 501 according to a fifth embodiment of the present invention.

The etching device 501 is different from the first embodiment in that the etching device 501 has an energy controlling power supply section 511 in place of the heater 11 as an acting part for controlling sticking probability S.

The energy controlling power supply section 511 applies an alternating voltage to an upper electrode 5A to control the energy of particles sticking to a wall. The frequency of the voltage is lower than the frequency of a voltage applied to the upper electrode 5A by an upper power supply section 7A to generate plasma. For example, the frequency of the voltage applied by the upper power supply section 7A is 500 MHz, and the frequency of the voltage applied by the energy controlling power supply section 511 is 13.56 MHz. Incidentally, the frequency of a voltage applied by a lower power supply section 7B is for example 2 MHz.

The configuration and operation of a signal processing system of the etching device 501 are substantially similar to the configuration and operation of the signal processing system of the etching device 1 described with reference to FIGS. 2 to 8. However, whereas the correction value calculating section 25 in the first embodiment calculates a correction value ΔT for the wall temperature T, a correction value calculating section 25 in the fifth embodiment calculates a correction value for the voltage applied by the energy controlling power supply section 511. In addition, a control section 17 controls the energy controlling power supply section 511 so as to change the voltage applied by the energy controlling power supply section 511 by the correction value. Incidentally, in simulation, a range of correction for the voltage of the energy controlling power supply section 511 was 300 W to 500 W.

The above embodiment provides similar effects to those of the first embodiment. That is, it is possible to maintain the chamber wall 9 in a desired state and stabilize an etching rate by controlling sticking probability S. As a result, semiconductor devices of good quality can be produced stably.

6. Sixth Embodiment

Figure 14:
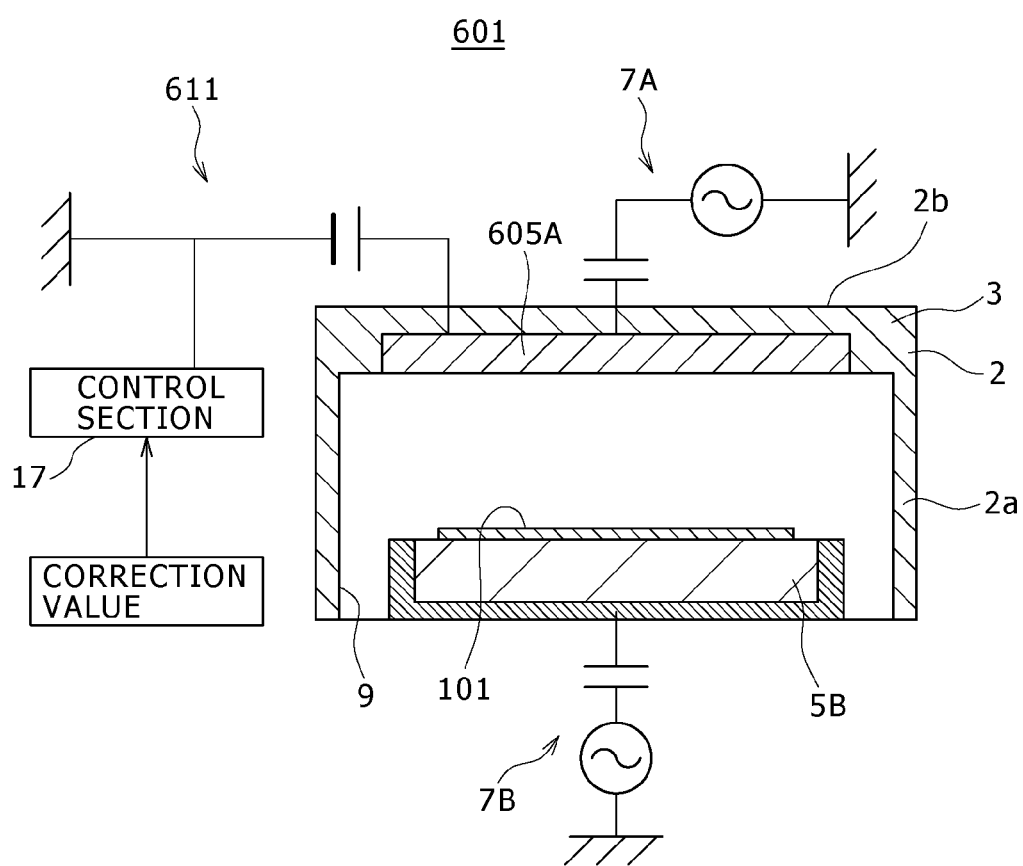
FIG. 14 is a conceptual diagram of an etching device according to a sixth embodiment of the present invention.

FIG. 14 is a conceptual diagram of an etching device 601 according to a sixth embodiment of the present invention.

In the etching device 601, an upper electrode 605A has a different composition from that of the upper electrode 5A in the first embodiment. In addition, the etching device 601 is different from the first embodiment in that the etching device 601 has a low-voltage power supply section 611 for applying a voltage to the upper electrode 605A in place of the heater 11 as an acting part for controlling sticking probability S.

The upper electrode 605A is formed of a material such as is changed in conductivity by applying a low voltage at a level not affecting plasma potential (for example 1 to 2 V) (material with a small band gap). For example, the upper electrode 605A is formed of a semiconductor obtained by injecting an impurity (B, P, As or the like) into Si.

Thus, by applying a voltage to the upper electrode 605A through the low-voltage power supply section 611, it is possible to change the conductivity of the upper electrode 605A, and in turn control the sticking probability S.

The impurity is desirably injected concentrically with a concentration gradient such that the concentration of the impurity is increased toward the periphery of the upper electrode 605A. This is because the sticking probability is effectively decreased toward the periphery. By thus changing the concentration in the radial direction of the electrode, sticking probability distribution in the radial direction of the electrode can be adjusted.

The configuration and operation of a signal processing system of the etching device 601 are substantially similar to the configuration and operation of the signal processing system of the etching device 1 described with reference to FIGS. 2 to 8. However, whereas the correction value calculating section 25 in the first embodiment calculates a correction value ΔT for the wall temperature T, a correction value calculating section 25 in the sixth embodiment calculates a correction value for the value of the voltage applied by the low-voltage power supply section 611. In addition, a control section 17 controls the low-voltage power supply section 611 so as to change the value of the voltage applied by the low-voltage power supply section 611 by the correction value.

Incidentally, a part in which a material changing in conductivity is used and to which a low voltage is applied is not limited to the upper electrode 5A. A material changing in conductivity may be used in an appropriate part such as a side wall 2a or the like, and a low voltage may be applied to the part.

The above embodiment provides similar effects to those of the first embodiment. That is, it is possible to maintain the chamber wall 9 in a desired state and stabilize an etching rate by controlling sticking probability S. As a result, semiconductor devices of good quality can be produced stably.

7. Seventh Embodiment

An etching device in a seventh embodiment has a similar hardware configuration to those of the first to sixth embodiments, and is different only in operation from the other embodiments. Specifically, the seventh embodiment is different from the other embodiments in that a process is stopped when a state within a chamber 2 exceeds a predetermined permissible range. In addition, the seventh embodiment is different from the other embodiments in that the seventh embodiment appropriately sets a target value of sticking probability and maintains the sticking probability at the target value, rather than maintaining the sticking probability at an initial value. A concrete description is as follows.

Figure 15:
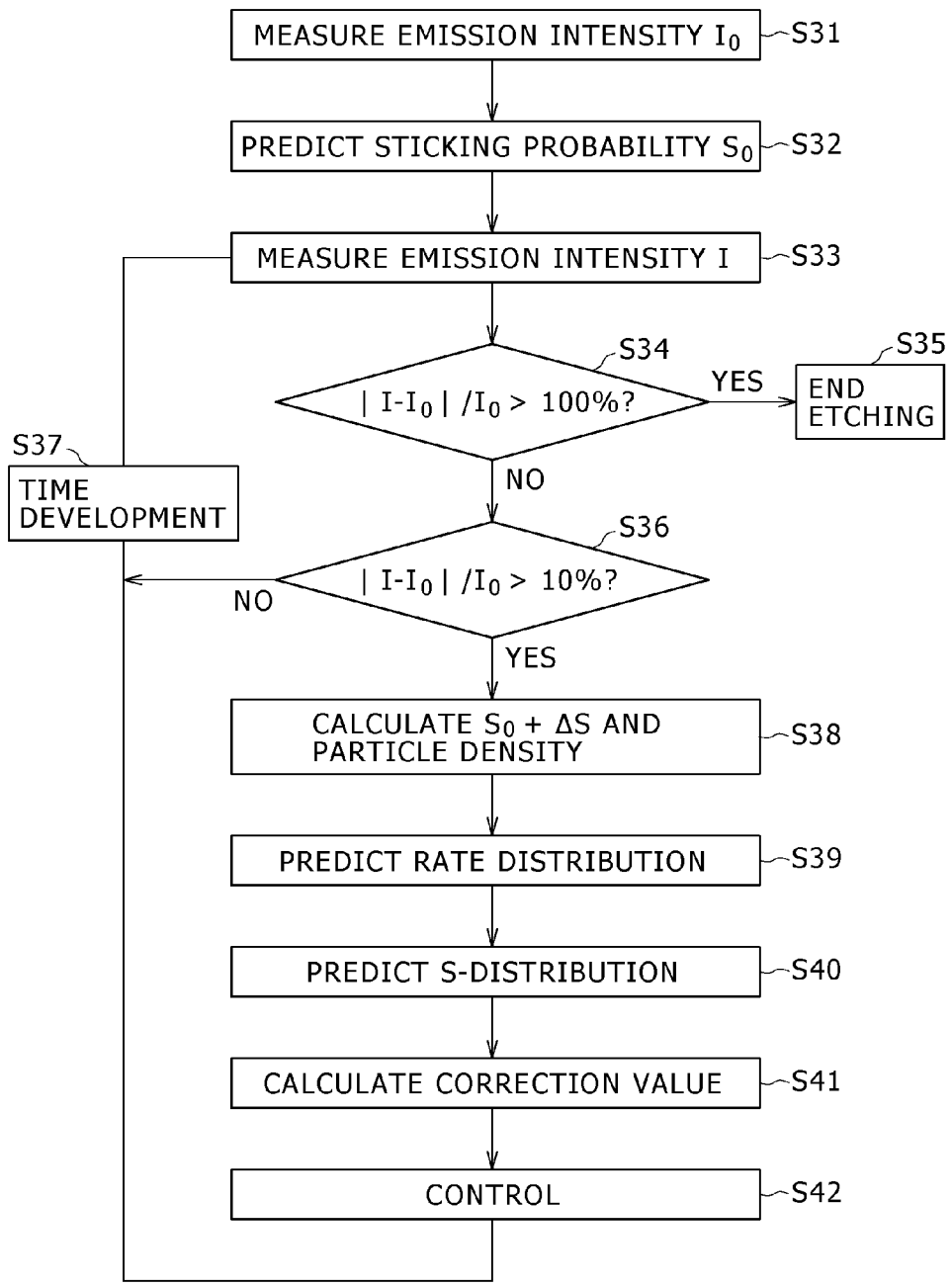
FIG. 15 is a flowchart of the procedure of processing performed by an etching device according to a seventh embodiment of the present invention.

FIG. 15 is a flowchart of the procedure of processing performed by an etching device according to the seventh embodiment of the present invention. As with the processing of FIG. 8, this processing is performed simultaneously with a start of a process.

Steps S31 to S33 are similar to steps S1 to S3 in FIG. 8.

In step S34, a simulation device 15 determines whether the absolute value of a difference between a present emission intensity I and an initial value of an emission intensity $I_0$ ($|I-I_0|$) has exceeded a predetermined stop reference value. The stop reference value is for example a value of 100% of the emission intensity $I_0$.

When it is determined that $|I-I_0|$ has exceeded the stop reference value, the etching device stops etching (step S35). Incidentally, the stopping of etching may be achieved by outputting an FDC (Fault Detection and Classification) signal from an FDC system to a control section 17, for example. When it is determined that $|I-I_0|$ has not exceeded the stop reference value, the process proceeds to step S36.

Steps S36 and S37 are similar to steps S4 and S5 in FIG. 8.

In step S38, the simulation device 15 calculates a sticking probability S ($S_0+\Delta S$) and a particle density n on the basis of the emission intensity I. As with the sticking probability S, a database associating the particle density n with the emission intensity I is constructed on the basis of a result of simulation performed by a simulation section 24, whereby the particle density n is calculated on the basis of the emission intensity I.

In step S39, the simulation device 15 calculates a present etching rate R on the basis of the particle density n. For example, the simulation device 15 constructs in advance a rate correlation database associating the particle density n with the etching rate R on the basis of a simulation result, and calculates the present etching rate R by referring to the database.

In step S40, the simulation device 15 calculates the particle density n satisfying a predetermined rate spec, and further calculates the sticking probability S satisfying the particle density n. That is, a target value for the sticking probability S is calculated. Incidentally, the rate spec may be the value of one rate, or a range of rate values. The particle density n corresponding to the rate spec is for example calculated by referring to the above-described rate correlation database. The sticking probability S corresponding to the particle density n is for example calculated by referring to a database associating the particle density n with the sticking probability S, which database is constructed on the basis of a result of simulation performed by the simulation section 24.

In step S41, a correction value for making the present sticking probability S the sticking probability S calculated in step S40 is calculated. For example, as in step S7 in FIG. 8, the correction value is calculated by referring to a database storing the dependence of the sticking probability S on a control value (wall temperature T, for example).

In step S42, an acting part (heater 11, for example) is controlled on the basis of the correction value calculated in step S41.

The above embodiment provides similar effects to those of the first embodiment. That is, it is possible to maintain the chamber wall 9 in a desired state and stabilize an etching rate by controlling sticking probability S. As a result, semiconductor devices of good quality can be produced stably. Incidentally, when the seventh embodiment is applied to thin film formation, a deposition rate is used in place of the etching rate.

The present invention is not limited to the above embodiments, but may be carried out in various modes.

The semiconductor manufacturing device is not limited to the etching devices. It suffices for the semiconductor manufacturing device to use particles (gas). For example, the semiconductor manufacturing device may perform thin film formation such as CVD, PVD and the like. In addition, the etching devices may perform reactive ion etching or reactive gas etching.

The system of the etching devices is not limited to CCP. The system may be for example ICP (Inductive Coupled Plasma) or ECR (Electron Cyclotron Resonance).

An object for etching or deposition is not limited to SiN, but may be silicon, oxide film, or other metallic film. Incidentally, a light emitting species to be monitored (detected wavelength range) may be changed as appropriate according to an object for etching or the like.

A rate obtained by simulation may be not only used for control of a semiconductor device as in the seventh embodiment but also used for profile simulation. In addition, simulation may be not only performed in advance before a process is performed and used to construct a database, but also performed while a process is being performed so that a result of the simulation is used to control the process.

A database associating an index value (for example emission intensity) or an etching rate with sticking probability may be constructed differently as appropriate according to a method of controlling the sticking probability (constitution of an acting part). For example, for control of the wall temperature (first embodiment), a database on sticking probability may be constructed with a wall species, a gas species, gas pressure, wall surface temperature, a gas flux, and processing time dependence taken into consideration. For control of light irradiation (second and third embodiments), a database on sticking probability may be constructed with a wall species, a gas species, gas pressure, an amount of light irradiation (or an amount of He gas), a gas flux, and processing time dependence taken into consideration. For control of applied voltage (fifth and sixth embodiments), a database on sticking probability may be constructed with a wall species, a gas species, gas pressure, the applied voltage, a gas flux, and processing time dependence taken into consideration. For control of gas addition (fourth embodiment), a database on sticking probability may be constructed with a wall species, an amount of addition of $O_2$ or polymer gas, gas pressure, a gas flux, and processing time dependence taken into consideration.

The present application contains subject matter related to that disclosed in Japanese Priority Patent Application JP 2009-293839 filed in the Japan Patent Office on Dec. 25, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor manufacturing device comprising:
   a chamber in which a wafer is disposed;
   a sensor configured to detect an index value indicating a state within the chamber;
   a sticking probability calculating section configured to determine a value of a sticking probability of particles sticking to a chamber wall of the chamber based on a value of the detected index value;
   an acting section capable of varying the sticking probability in the chamber; and
   a control section configured to control the acting section so that the value of the sticking probability determined by the sticking probability calculating section is a predetermined value,
   wherein,
   the index value is an emission intensity of particles,
   the sensor detects an initial value of the emission intensity of particles and thereafter detects a present value of the emission intensity of particles at predetermined time intervals, and
   when an absolute value of a difference between the present value of the emission intensity of particles and the initial value of the emission intensity of particles exceeds a threshold value, the sticking probability calculating section determines the value of the sticking probability based on the present value of the emission intensity of particles detected by the sensor, the sticking probability calculating section referring to a sticking probability database that holds values of the sticking probability associated with corresponding values of the emission intensity of particles to determine the value of the sticking probability.

2. The semiconductor manufacturing device according to claim 1, further comprising:
   a particle density calculating block configured to calculate a particle density by performing a time development type simulation based on a differential equation of the particle density, the differential equation including, as a parameter, a sticking probability set to each of a plurality of mesh walls obtained by dividing the chamber wall;

an index value calculating section configured to calculate the index value based on the calculated particle density; and a storage section configured to store data retaining the sticking probability and the index value calculated by the index value calculating section in association with each other, the storage section including the database, wherein, the sticking probability calculating section determines the value of the sticking probability corresponding to the value of the detected index value by referring to the data in the database.

3. The semiconductor manufacturing device according to claim 2, wherein the differential equation includes, as another parameter, a distance between a position at which the particle density is calculated and each of the plurality of mesh walls.

4. The semiconductor manufacturing device according to claim 2, wherein:

the particle density calculating block calculates the particle density in each of a plurality of mesh spaces obtained by dividing a space inside of the chamber, the index value calculating section calculates an emission intensity in each of the plurality of mesh spaces based on the particle density in each of the plurality of mesh spaces, and integrates the calculated emission intensity in each of the plurality of mesh spaces in a direction of a predetermined line of sight, and the sensor detects the emission intensity in the direction of the predetermined line of sight.

5. The semiconductor manufacturing device according to claim 1, wherein:

the acting section includes a light irradiating section configured to irradiate the chamber wall with light, and the control section controls an amount of light irradiation of the light irradiating section so that the value of the sticking probability determined by the sticking probability calculating section is the predetermined value.

6. The semiconductor manufacturing device according to claim 1, wherein:

(i) the acting section includes
  a chopper movable between a covering position to cover the wafer and a retracted position retracted from the covering position, and
  a gas supplying section capable of supplying a predetermined gas affecting the sticking probability on an opposite side of the chopper in the covering position from the wafer within the chamber, and (ii) the control section controls an amount of supply of the predetermined gas so that the value of the sticking probability determined by the sticking probability calculating section is the predetermined value.

7. The semiconductor manufacturing device according to claim 1, wherein:

(i) the acting section includes
  a chopper movable between a covering position to cover the wafer and a retracted position retracted from the covering position, and
  a gas supplying section capable of supplying a plurality of species of gases affecting the sticking probability on an opposite side of the chopper in the covering position from the wafer within the chamber, and (ii) the control section controls a kind of supplied gas so that the value of the sticking probability determined by the sticking probability calculating section is the predetermined value.

8. The semiconductor manufacturing device according to claim 1, wherein:

(i) the acting section includes
  an electrode forming a part of the chamber wall, and
  a power supply section capable of applying a high-frequency voltage for generating plasma and a low-frequency voltage for controlling energy of particles to the electrode, and (ii) the control section controls a voltage value of the low-frequency voltage so that the value of the sticking probability determined by the sticking probability calculating section is the predetermined value.

9. The semiconductor manufacturing device according to claim 1, wherein:

(i) the acting section includes
  a conductivity varying section formed of a material changing in conductivity according to a voltage applied to the material and forming at least a part of the chamber wall, and
  a power supply section capable of applying a voltage to the conductivity varying section, and (ii) the control section controls the voltage applied to the conductivity varying section so that the value of the sticking probability determined by the sticking probability calculating section is the predetermined value.

10. The semiconductor manufacturing device according to claim 1, wherein the sticking probability calculating section determines the value of the sticking probability by identifying a value of the sticking probability in the sticking probability database that corresponds to the present value of the emission intensity of particles detected by the sensor.

11. The semiconductor manufacturing device according to claim 1, wherein the sticking probability calculating section determines the value of the sticking probability by performing an interpolation calculation based on the values of the emission intensity of particles in the sticking probability database.

12. The semiconductor manufacturing device according to claim 1, wherein:

the acting section includes a heater configured to control a temperature of the chamber wall, and the control section controls the heater so that the value of the sticking probability determined by the sticking probability calculating section is the predetermined value.

13. The semiconductor manufacturing device according to claim 1, wherein the threshold value is expressed as a percentage of the initial value of the emission intensity of particles.

14. The semiconductor manufacturing device according to claim 1, wherein the predetermined value is an initial value of the sticking probability.

15. The semiconductor manufacturing device according to claim 1, wherein the predetermined value is a target value of the sticking probability that is dynamically determined based on a particle density.

16. A semiconductor device manufacturing method comprising the steps of:

detecting an index value indicating a state within a chamber;

determining a value of a sticking probability of particles sticking to a chamber wall of the chamber based on a value of the detected index value; and controlling a physical quantity affecting the sticking probability so that the determined value of the sticking probability is a predetermined value, wherein,
the index value is an emission intensity of particles,
the step of detecting the index value includes detecting an initial value of the emission intensity of particles and thereafter detecting a present value of the emission intensity of particles at predetermined time intervals, and
when an absolute value of a difference between the present value of the emission intensity of particles and the initial value of the emission intensity of particles exceeds a threshold value, the value of the sticking probability is determined based on the present detected value of the emission intensity of particles, the step of determining the value of the sticking probability including referring to a sticking probability database that holds values of the sticking probability associated with corresponding values of the emission intensity of particles.

17. The semiconductor manufacturing method according to claim 16, wherein the predefined permissible value is expressed as a predefined percentage of the initial value of the emission intensity of particles.

18. The semiconductor manufacturing method according to claim 16, wherein the predetermined value is an initial value of the sticking probability.

19. The semiconductor manufacturing method according to claim 16, wherein the predetermined value is a target value of the sticking probability that is dynamically determined based on a particle density.

\* \* \* \* \*